US009126824B2

(12) United States Patent
Saito

(10) Patent No.: US 9,126,824 B2
(45) Date of Patent: Sep. 8, 2015

(54) ELECTRICAL COMPONENT AND METHOD OF MANUFACTURING THE SAME

(71) Applicant: KABUSHIKI KAISHA TOSHIBA, Minato-ku, Tokyo (JP)

(72) Inventor: Tomohiro Saito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/962,885

(22) Filed: Aug. 8, 2013

(65) Prior Publication Data
US 2014/0231934 A1 Aug. 21, 2014

(30) Foreign Application Priority Data

Feb. 15, 2013 (JP) .................................. 2013-027926

(51) Int. Cl.
H01L 29/84 (2006.01)
B81B 7/00 (2006.01)
B81C 1/00 (2006.01)

(52) U.S. Cl.
CPC ........... *B81B 7/0035* (2013.01); *B81C 1/00277* (2013.01)

(58) Field of Classification Search
CPC ................. B81B 7/0035; B81B 7/007; B81B 2201/0257; B81C 1/00277; B81C 1/00; H01L 21/56; H01L 24/11; H01L 41/33
USPC .......... 257/254, 414–420, E21.502, E21.002, 257/E21.499, E21.324; 438/50, 51
See application file for complete search history.

(56) References Cited

U.S. PATENT DOCUMENTS

| | | | | | |
|---|---|---|---|---|---|
| 4,838,088 | A | * | 6/1989 | Murakami | 73/724 |
| 8,309,858 | B2 | * | 11/2012 | Kojima et al. | 174/260 |
| 8,581,354 | B2 | * | 11/2013 | Fujimori et al. | 257/415 |
| 8,921,958 | B2 | * | 12/2014 | Ikehashi | 257/417 |
| 2008/0297992 | A1 | * | 12/2008 | Obata et al. | 361/679 |
| 2009/0101383 | A1 | * | 4/2009 | Miyagi et al. | 174/50.5 |
| 2009/0179287 | A1 | * | 7/2009 | Inaba | 257/415 |
| 2010/0213039 | A1 | * | 8/2010 | Saito | 200/181 |
| 2010/0284553 | A1 | * | 11/2010 | Conti et al. | 381/174 |
| 2010/0308423 | A1 | * | 12/2010 | Shimooka | 257/415 |

(Continued)

FOREIGN PATENT DOCUMENTS

| | | |
|---|---|---|
| JP | 2009184102 A | 8/2009 |
| JP | 2009-196078 A | 9/2009 |

(Continued)

OTHER PUBLICATIONS

Japanese Office Action (and English translation thereof) dated Jun. 16, 2015, issued in counterpart Japanese Application No. 2013-027926.

*Primary Examiner* — Yosef Gebreyesus
(74) *Attorney, Agent, or Firm* — Holtz, Holtz, Goodman & Chick PC

(57) ABSTRACT

According to one embodiment, an electrical component comprises a substrate, a functional element formed on the substrate, a first layer configured to form a cavity which stores the functional element on the substrate, the first layer having through holes, the first layer having a first recessed portion and a first projecting portion on an upper surface thereof, and the first layer having different film thicknesses in a direction perpendicular to a surface of the substrate, and a second layer formed on the first layer and configured to close the through holes.

8 Claims, 24 Drawing Sheets

(56) References Cited

U.S. PATENT DOCUMENTS

| | | |
|---|---|---|
| 2011/0241136 A1* | 10/2011 | Inaba .............................. 257/415 |
| 2012/0049390 A1* | 3/2012 | Shimooka et al. ............. 257/790 |
| 2012/0104593 A1* | 5/2012 | Kanemoto et al. ............. 257/729 |
| 2012/0228726 A1* | 9/2012 | Saito .............................. 257/415 |
| 2012/0256692 A1* | 10/2012 | Yajima et al. ................... 331/25 |
| 2013/0285164 A1* | 10/2013 | Saito et al. .................... 257/415 |

FOREIGN PATENT DOCUMENTS

| | | |
|---|---|---|
| JP | 2010-188664 A | 9/2010 |
| JP | 2012-045656 A | 3/2012 |

* cited by examiner

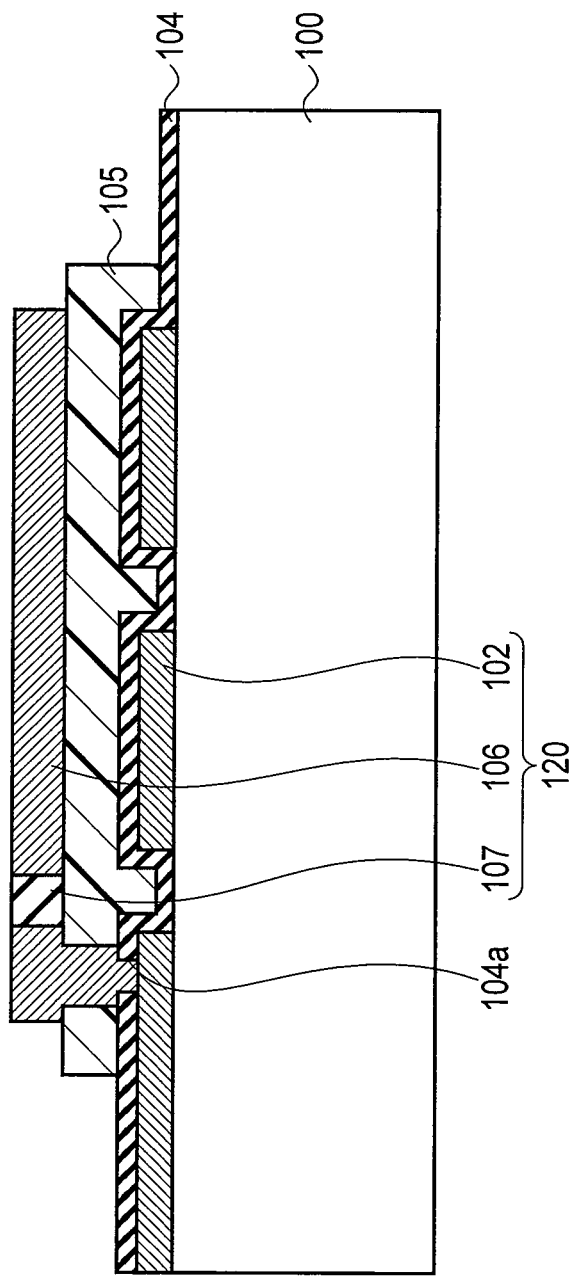
F I G. 6

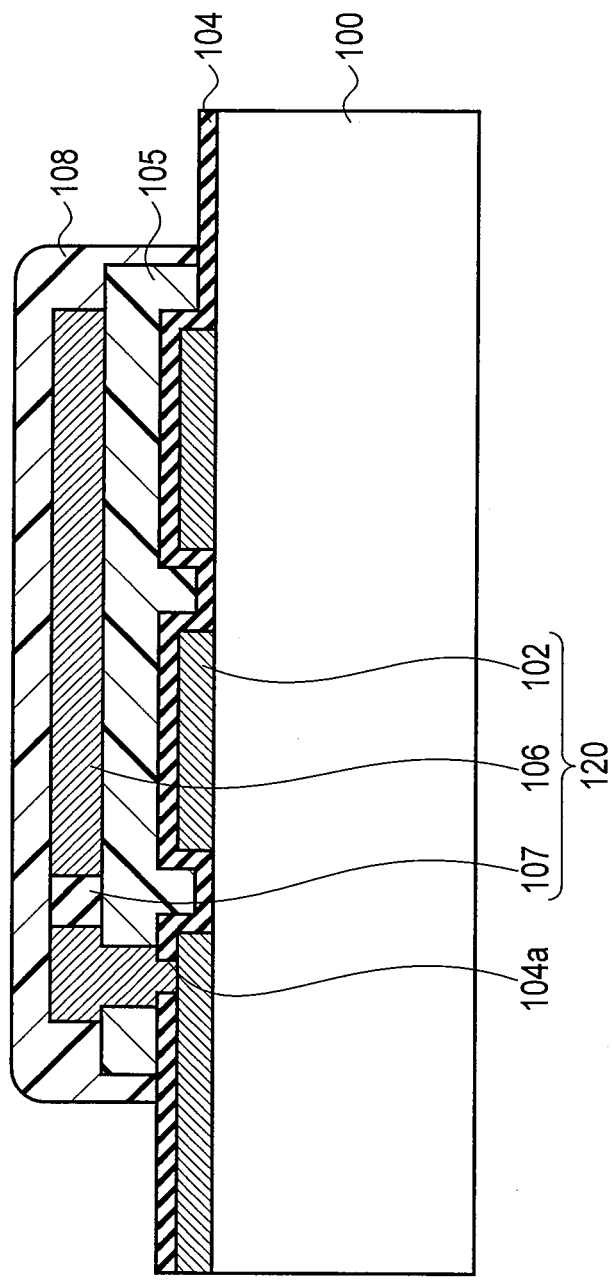
F I G. 7

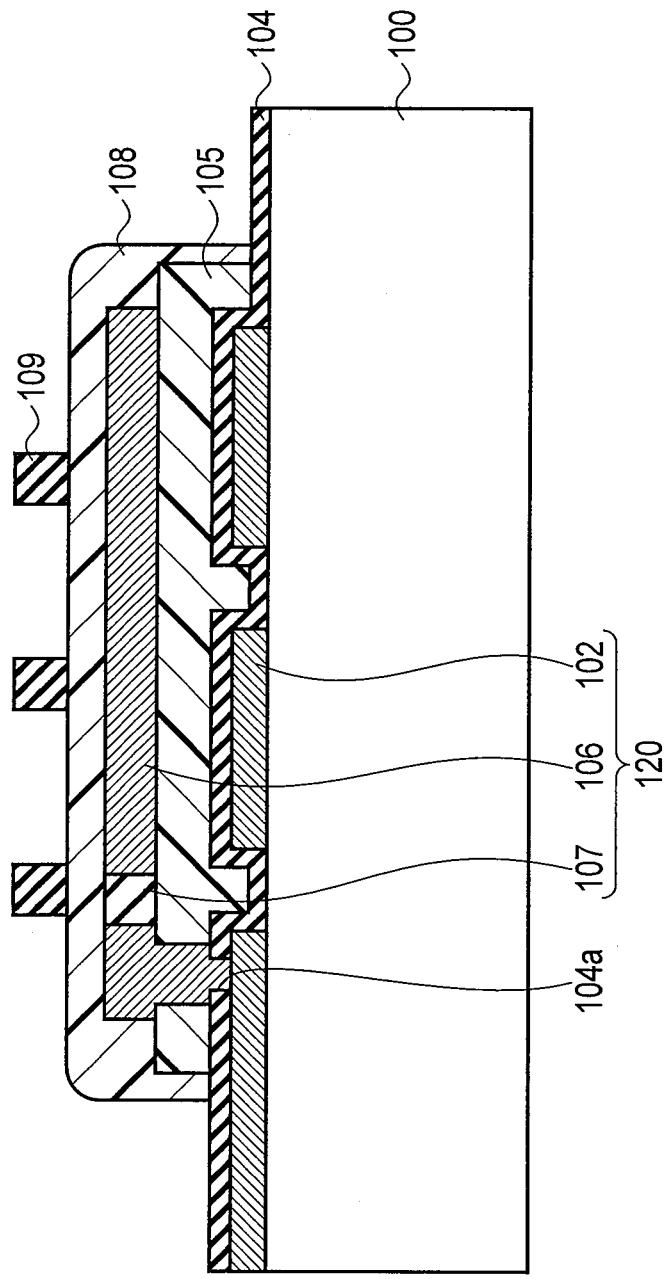
F I G. 8

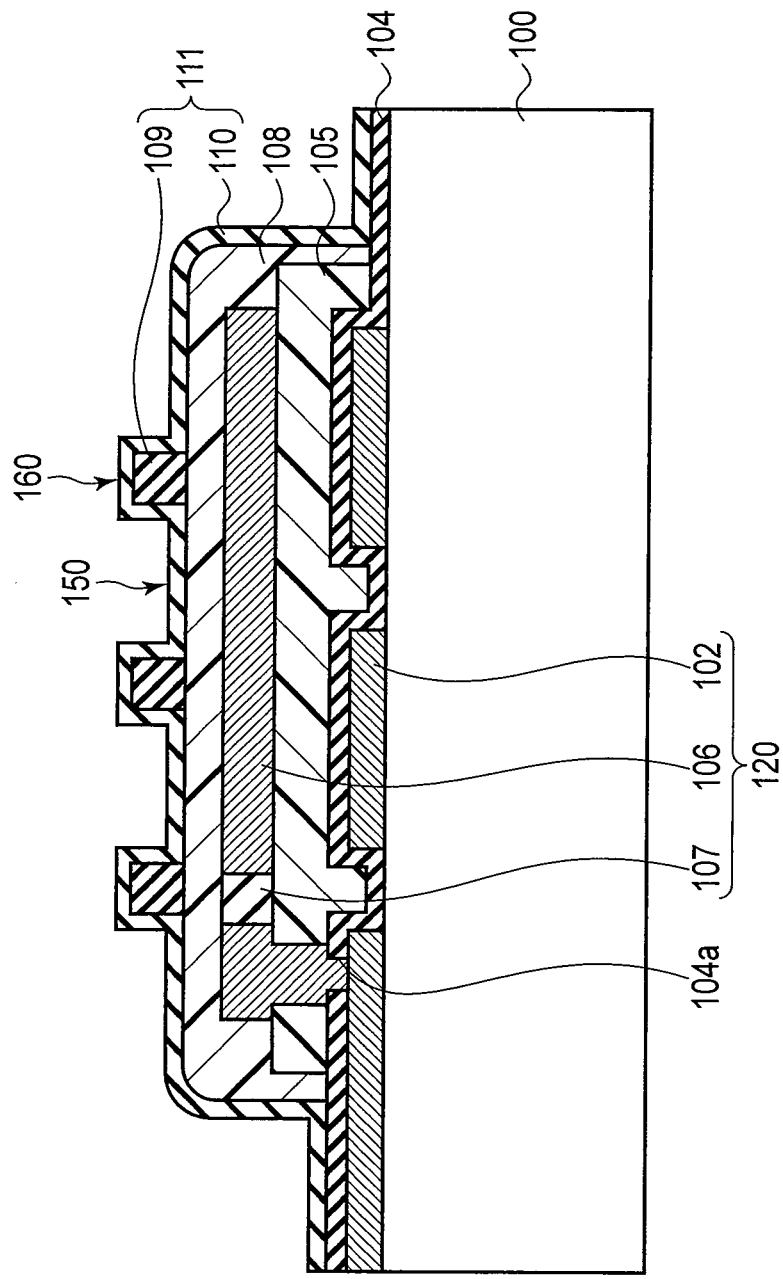
F I G. 9

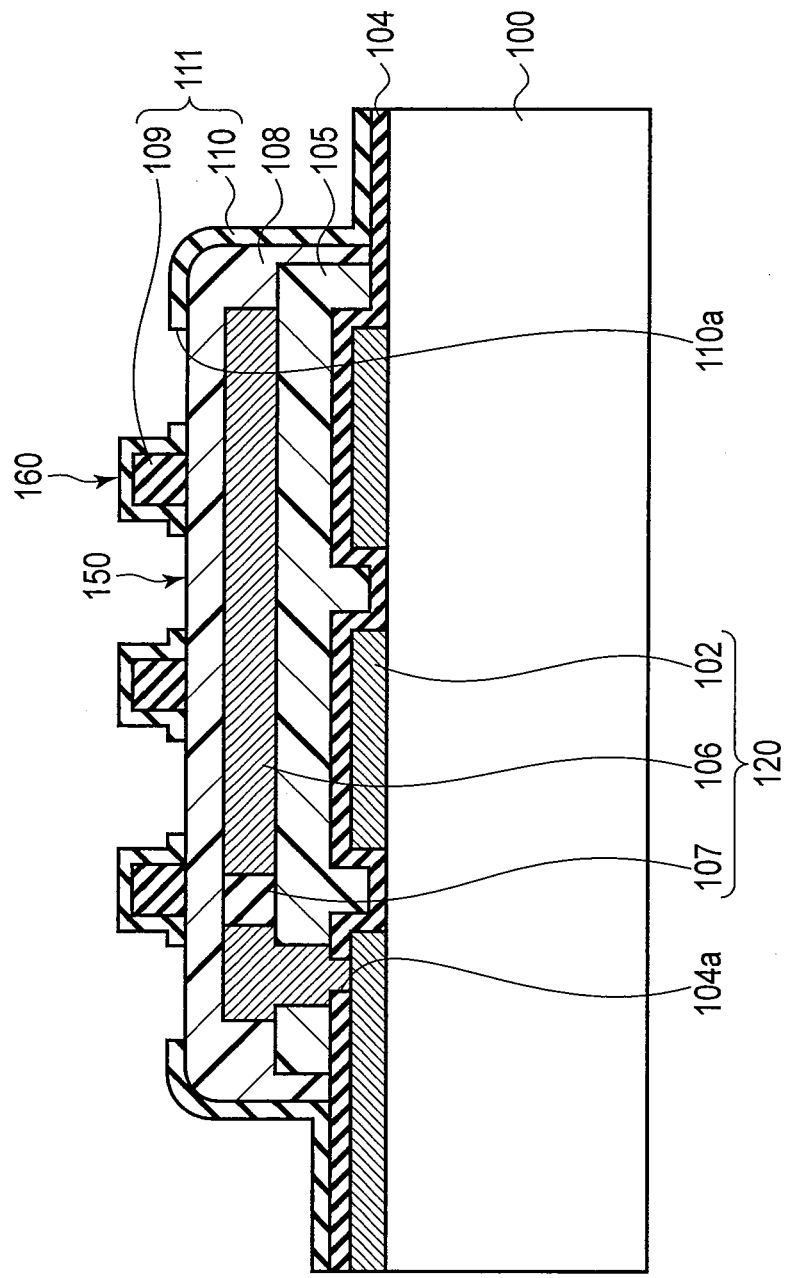
F I G. 10

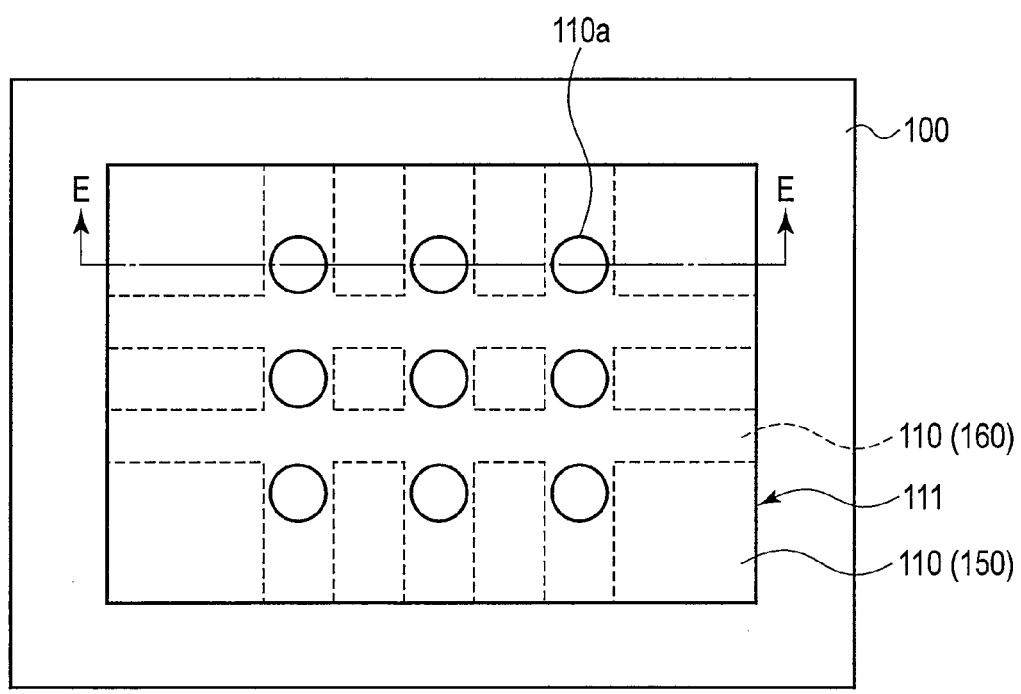
F I G. 20

ELECTRICAL COMPONENT AND METHOD OF MANUFACTURING THE SAME

CROSS-REFERENCE TO RELATED APPLICATIONS

This application is based upon and claims the benefit of priority from Japanese Patent Application No. 2013-027926, filed Feb. 15, 2013, the entire contents of which are incorporated herein by reference.

FIELD

Embodiments described herein relate generally to an electrical component and a method of manufacturing the same.

BACKGROUND

A MEMS (Micro Electro Mechanical Systems) device formed by a movable electrode and fixed electrode has features of low loss, high insulation performance, and linearity. Hence, a MEMS device such as a capacitor, a switch, or an acceleration sensor is attracting a great deal of attention as a key device for a next-generation portable cellular phone.

A feature of a MEMS device lies in that it has a mechanically movable portion (MEMS element), unlike a normal semiconductor device. Therefore, a MEMS device cannot be directly packaged on a circuit substrate, and the packaging operation requires forming a protective cover having a cavity. Especially, in terms of the cost and size, it is very effective to form a protective cover (thin-film dome) using the same process as that of manufacturing a MEMS device.

There is provided a method of manufacturing a MEMS element having a movable portion, and a thin-film dome structure which stores the MEMS element, that includes the step of forming and patterning a first sacrificial layer, the step of forming a MEMS element on the first sacrificial layer, the step of forming a second sacrificial layer on the first sacrificial layer and MEMS element, and patterning it, the step of forming a first layer (for example, an $SiO_X$ film) on the second sacrificial layer, the step of forming through holes in the first layer, the step of removing the first sacrificial layer and second sacrificial layer via the through holes, the step of forming a second layer which closes the through holes on the first layer, and the step of forming a third layer (for example, an SiN film) having a moisture-proof property on the second layer. The first, second, and third layers form a thin-film dome having a cavity.

In forming this thin-film dome structure, when the thin-film dome deforms due to expansion of a cavity portion, a crack is generated in a stress concentration portion due to the deformation. This may degrade the sealing performance of the dome interior, thus degrading the reliability of the device.

BRIEF DESCRIPTION OF THE DRAWINGS

FIGS. 4 to 11 are sectional views showing the steps of manufacturing an electrical component according to the first embodiment;
FIG. 20 is a plan view illustrating another example of the structure of an electrical component according to the second embodiment.

DETAILED DESCRIPTION

Figure 1:
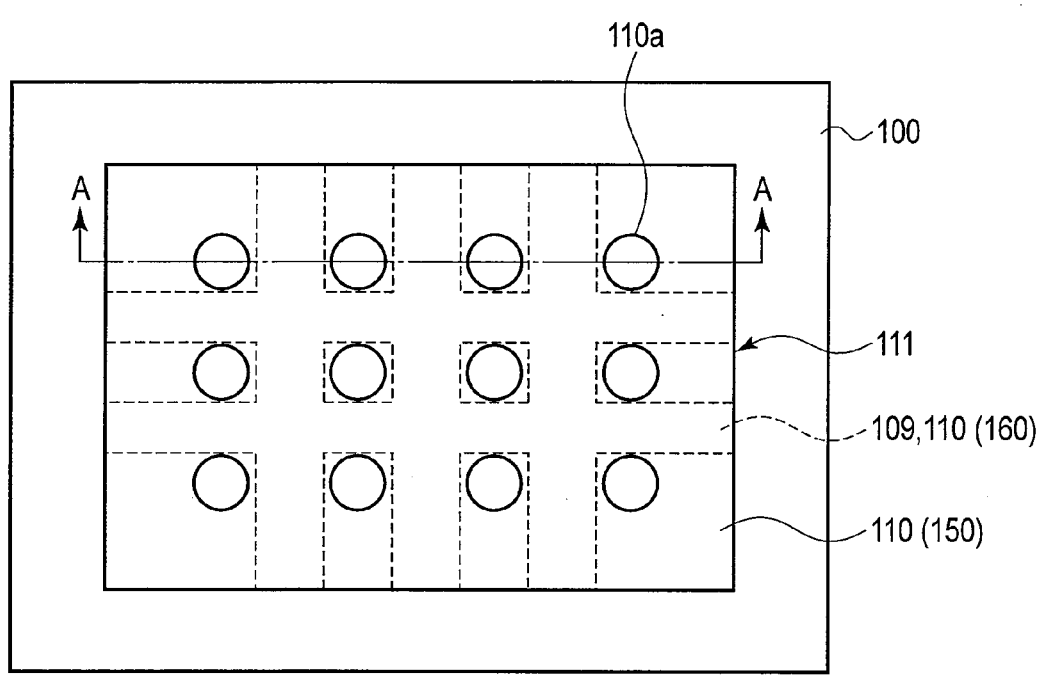
FIG. 1 is a plan view showing the structure of an electrical component according to the first embodiment.

In general, according to one embodiment, an electrical component comprises a substrate, a functional element formed on the substrate, a first layer configured to form a cavity which stores the functional element on the substrate, the first layer having through holes, the first layer having a first recessed portion and a first projecting portion on an upper surface thereof, and the first layer having different film thicknesses in a direction perpendicular to a surface of the substrate, and a second layer formed on the first layer and configured to close the through holes.

In forming a thin-film dome, a crack may be generated in the first layer positioned especially in the lowermost layer of the thin-film dome. This crack is generated as a cavity portion expands in depositing a third layer. More specifically, the first layer formed by an $SiO_X$ film deforms due to expansion of the cavity portion, and a crack is generated in a stress concentration portion due to the deformation. When a crack is generated in the first layer, it becomes the starting point of a path which connects the interior and exterior of the thin-film dome to each other. This may degrade the sealing performance of the dome interior, thus degrading the reliability of the device.

On the other hand, to avoid a crack, it is effective to increase the thickness of the first layer. However, when the thickness of the first layer increases, it becomes difficult to form through holes in the first layer. That is, since the processed thickness of the first layer increases, a problem associated with the durability of a resist mask may be posed in, for example, RIE (Reactive Ion Etching) to form through holes.

In contrast, in this embodiment, projections and recesses are formed in the surface of the first layer to have partially different film thicknesses, thereby solving the above-mentioned problem.

Embodiments will be described below with reference to the accompanying drawings. In these drawings, the same reference numerals denote the same parts. Note that a repetitive description will be given as needed.

<First Embodiment>

An electrical component according to the first embodiment will be described with reference to FIGS. 1 to 17. The first embodiment provides an example in which a first layer 111 has, on its upper surface, a first recessed portion 150 (groove portion) and a first projecting portion 160 (protruding portion). This makes it possible to suppress generation of a crack in the first layer 111. The first embodiment will be described in detail below.

[Structure According to First Embodiment]

Figure 2:
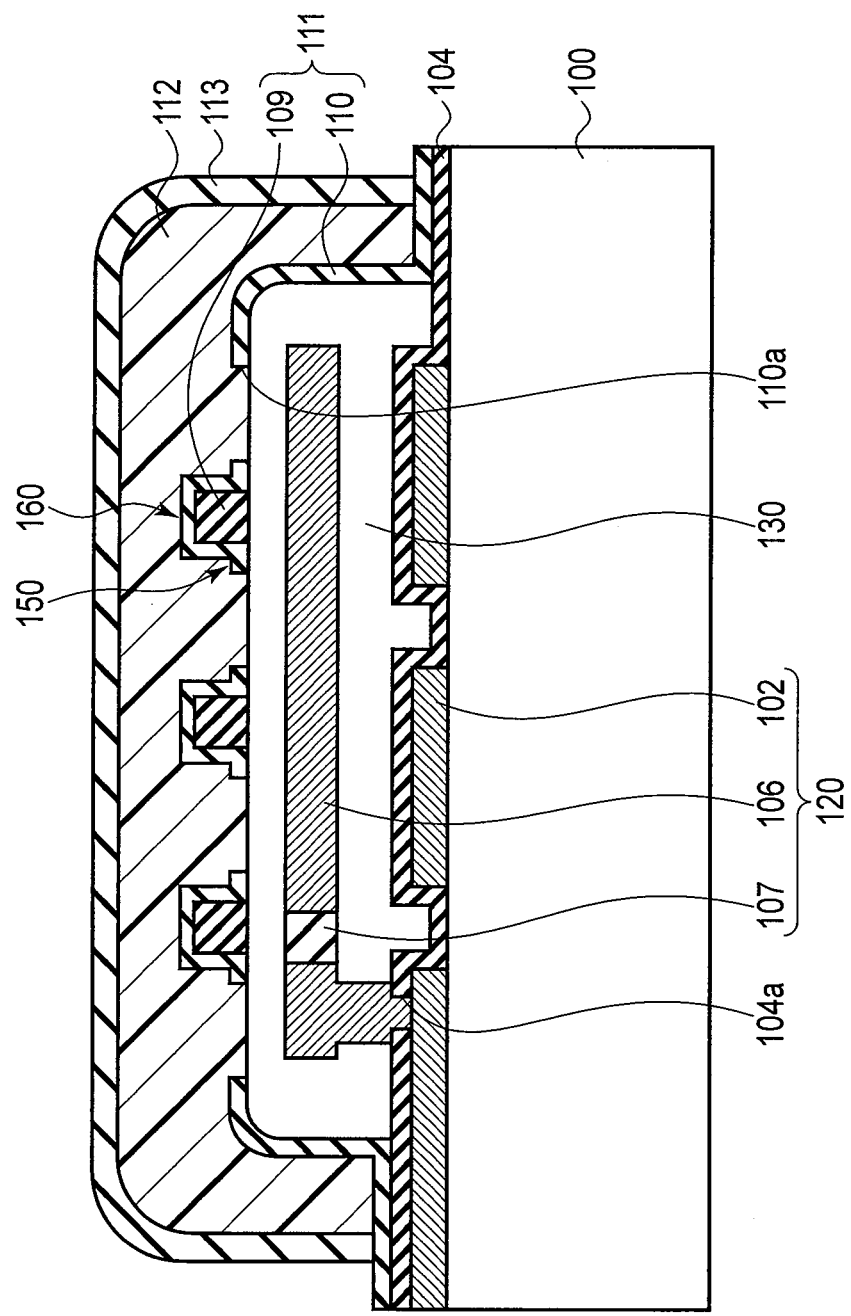
FIG. 2 is a sectional view taken along a line A-A in FIG. 1.
Figure 3:
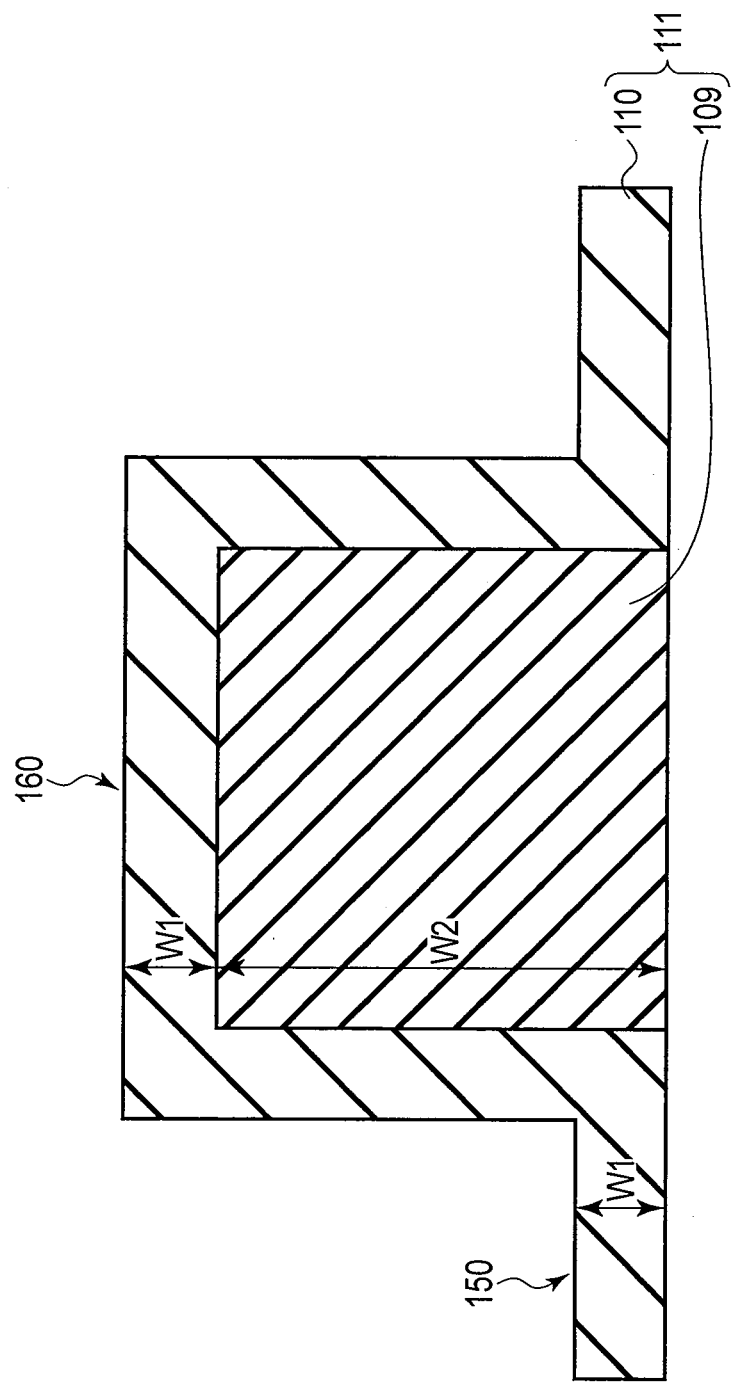
FIG. 3 is a partial enlarged view in FIG. 2.

FIG. 1 is a plan view showing the structure of an electrical component according to the first embodiment, and mainly shows the first layer 111. FIG. 2 is a sectional view taken along a line A-A in FIG. 1. FIG. 3 is a partial enlarged view in FIG. 2, and mainly shows the first layer 111.

The electrical component according to the first embodiment includes a functional element 120 formed on a substrate 100, and a thin-film dome formed by the first layer 111, a second layer 112, and a third layer 113, as shown in FIG. 2.

The substrate 100 is, for example, a silicon substrate or insulator substrate having an insulating film formed on its surface. The functional element 120 is formed on the substrate 100. The functional element 120 is, for example, an electrostatic driving MEMS variable capacitor.

The functional element 120 is formed by a first metal interconnection (electrode) 102, a second metal interconnection (electrode) 106 opposed to the first metal interconnection 102, and an insulator connecting portion 107 which connects second metal interconnections 106 to each other. The first metal interconnection 102 and second metal interconnection 106 are formed by, for example, aluminum. The insulator connecting portion 107 is formed by, for example, an SiN film. When a voltage is applied across the first metal interconnection 102 and the second metal interconnection 106, the distance between the first metal interconnection 102 and the second metal interconnection 106 changes due to an electrostatic attractive force, so the capacitance of the functional element 120 changes.

A passivation film 104 constituted by, for example, an $SiO_X$ film or an SiN film is formed on the first metal interconnection 102. The passivation film 104 functions as an insulating film for a capacitor. The passivation film 104 has openings in a connecting hole portion 104a. In the connecting hole portion 104a, the first metal interconnection 102 and second metal interconnection 106 are electrically connected to each other.

The functional element 120 is formed in a cavity 130. The cavity 130 is a region to ensure the operating space of the functional element 120. The interior of the cavity 130 is maintained in a dry atmosphere or a vacuum atmosphere. This prevents deterioration of the first metal interconnection 102 and second metal interconnection 106 formed by aluminum due to a corrosive gas such as moisture, and, in turn, prevents degradation in property of a MEMS variable capacitor.

The first layer 111 forms the cavity 130 which stores the functional element 120, and has a plurality of through holes (openings) 110a. The plurality of through holes 110a in the first layer 111 serve to, after the functional element 120 is formed, remove a sacrificial layer (to be described later) by etching to form the cavity 130. That is, the sacrificial layer is etched via the through holes 110a.

The first layer 111 will be described in detail later.

The second layer 112 is formed on the first layer 111 to close the plurality of through holes 110a. The second layer 112 has a function of sealing the cavity 130.

The second layer 112 is desirably formed by a coating film of an organic material such as polyimide. This makes it possible to easily, reliably seal the through holes 110a even if the size (diameter or opening area) of the through holes 110a is large. By arranging a plurality of large through holes 110a, a sacrificial layer (to be described later) can be reliably etched in a short time.

Note that the second layer 112 is not limited to a coating film of an organic material, and may be formed by an insulating film such as an $SiO_X$ film or an SiN film.

The third layer 113 is formed on the second layer 112. The third layer 113 functions as a moisture-proof film which prevents moisture in the air from penetrating the second layer 112 and entering the cavity 130. The third layer 113 is formed by, for example, an insulating film such as an SiN film.

The first layer 111, second layer 112, and third layer 113 function as a thin-film dome for protecting the functional element 120 from the outside.

The first layer 111 in the first embodiment will be described below.

The first layer 111 in the first embodiment has, on its upper surface, the first recessed portion 150 and first projecting portion 160, as shown in FIGS. 1 and 2. Also, the first layer 111 is flat on its lower surface. In other words, the first layer 111 has different levels on its upper surface. With this structure, the first layer 111 has a thickness that varies in a direction perpendicular to the substrate surface. The thickness of the first layer 111 will be described in detail later.

Note that in the first embodiment, the first recessed portion 150 shows a region other than the first projecting portion 160 in the first layer 111.

The first layer 111 is constituted by a side portion, an upper portion, and a corner portion which connects them to each other to form the cavity 130. The first layer 111 has the first recessed portion 150 and first projecting portion 160 on the upper surface of the upper portion. The first projecting portion 160 is formed to extend in, for example, a first direction and a second direction perpendicular to the first direction in the plane.

The first layer 111 having the first recessed portion 150 and first projecting portion 160 on its upper surface is formed by a first insulating film 109 and second insulating film 110. The first insulating film 109 is in midair (forms the cavity 130), and is formed by patterning to extend in, for example, the first direction and the second direction perpendicular to the first direction. The second insulating film 110 covers the first insulating film 109, and is formed continuously on the entire surface. More specifically, the second insulating film 110 is formed on the side and upper surfaces of the first insulating film 109, and is in midair (forms the cavity 130) in the remaining region. Also, the lower surface of the first insulating film 109 in midair is equal in level to the lower surface of the second insulating film 110 in midair. With this operation, the lower surface of the first layer 111 is formed almost flat.

The first projecting portion 160 is formed by the first insulating film 109 in midair, and the second insulating film 110 formed on the first insulating film 109. That is, the first projecting portion 160 is formed by a stacked structure of the first insulating film 109 and second insulating film 110. On the other hand, the first recessed portion 150 is formed by the second insulating film 110 in midair. That is, the first recessed portion 150 is formed by the single-layered structure of the second insulating film 110.

In other words, the second insulating film 110 has the first recessed portion 150 and first projecting portion 160 on its upper surface, and projecting and recessed portions at positions corresponding to the first recessed portion 150 and first projecting portion 160 on its lower surface. The first insulating film 109 is buried in the recessed portion (the lower portion of the first projecting portion 160) in the lower surface of the second insulating film 110.

The first insulating film 109 and second insulating film 110 are formed by insulating films such as $SiO_X$ films or SiN films. Note that in terms of the process, the first insulating film 109 and second insulating film 110 are desirably insulating films containing the same material.

The film thickness in the first projecting portion 160 in a direction perpendicular to the substrate surface is larger than that in the first recessed portion 150 in the direction perpendicular to the substrate surface, as shown in FIG. 3. More specifically, the film thickness in the first projecting portion 160 in a direction perpendicular to the substrate surface is equal to the total thickness of a thickness W2 of the first insulating film 109 in the film deposition direction, and a thickness W1 of the second insulating film 110 in the film deposition direction. On the other hand, the film thickness in the first recessed portion 150 in a direction perpendicular to the substrate surface is equal to the thickness W1 of the second insulating film 110 in the film deposition direction. That is, the film thickness in the first projecting portion 160 in a direction perpendicular to the substrate surface is larger than that in the first recessed portion 150 in the direction perpendicular to the substrate surface by the thickness W2 of the first insulating film 109 in the film deposition direction.

Note that the film thickness in the first projecting portion 160 in a direction perpendicular to the substrate surface is desirably about twice that in the first recessed portion 150 in the direction perpendicular to the substrate surface. That is, the thickness W1 of the second insulating film 110 in the film deposition direction is desirably equal to the thickness W2 of the first insulating film 109 in the film deposition direction. More specifically, the film thickness in the first projecting portion 160 in a direction perpendicular to the substrate surface is, for example, about 6 μm, and that in the first recessed portion 150 in the direction perpendicular to the substrate surface is, for example, about 3 μm. However, the present embodiment is not limited to this, and a first recessed portion 150 with a small film thickness, and a first projecting portion 160 with a large film thickness need only be formed in the first insulating film 109.

With this arrangement, the mechanical strength of the first insulating film 109 can be increased by forming a first projecting portion 160 with a large film thickness in a direction perpendicular to the substrate surface in the first insulating film 109. That is, the first insulating film 109 functions as a reinforcing member.

Also, the plurality of through holes 110a are formed in the first recessed portion 150 (second insulating film 110) with a small film thickness in the first insulating film 109, as shown in FIGS. 1 and 2. This makes it possible to easily perform the processing step of forming the through holes 110a.

[Manufacturing Method According to First Embodiment]

FIGS. 4 to 13 are sectional views showing the steps of manufacturing an electrical component according to the first embodiment. A process from the step of forming a MEMS element to that of forming a thin-film dome in an electrical component according to the first embodiment will be described below.

Figure 4:
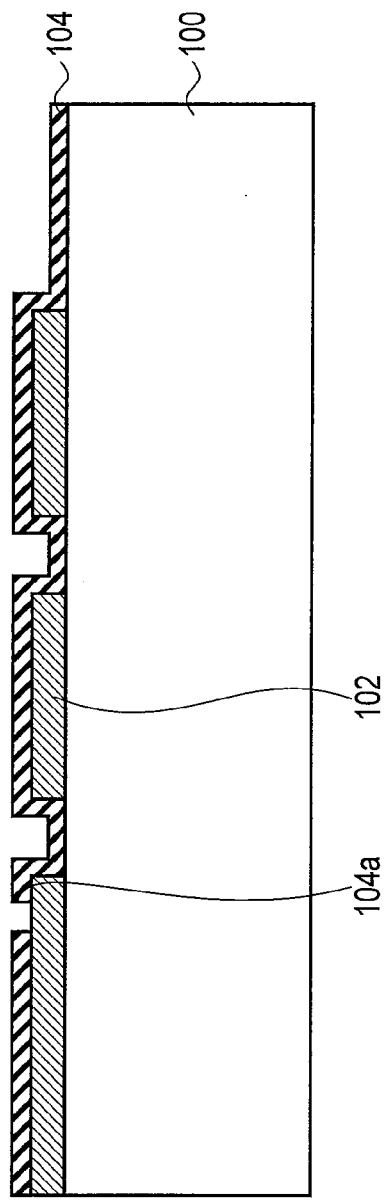

First, as shown in FIG. 4, in the step of forming a MEMS element, a first metal interconnection 102 consisting of, for example, aluminum is formed on a substrate 100 as a silicon substrate or insulator substrate having an insulating film formed on its surface, and is patterned. The first metal interconnection 102 is formed to have a thickness of, for example, several hundred nanometers to several micrometers. The sputtering method, for example, is used as a method of depositing the first metal interconnection 102. Also, as a patterning method, the conventional photolithography or RIE (Reactive Ion Etching) method, for example, may be used, or the photolithography and wet etching methods may be used.

A passivation film 104 which is constituted by, for example, an $SiO_X$ film or an SiN film, and functions as an insulating film for a capacitor is formed on the entire surface. As a method of depositing the passivation film 104, the CVD (Chemical Vapor Deposition) method, for example, is used. The passivation film 104 is formed to have a thickness of, for example, several hundred nanometers to several micrometers. The passivation film 104 is patterned to form a connecting hole portion 104a. That is, the first metal interconnection 102 is exposed in the connecting hole portion 104a. As a method of patterning the passivation film 104, the photolithography or RIE method, for example, is used.

A first sacrificial layer 105 formed by an organic material such as polyimide is applied to cover the first metal interconnection 102. The first sacrificial layer 105 is formed to have a thickness of, for example, several hundred nanometers to several micrometers.

Figure 5:
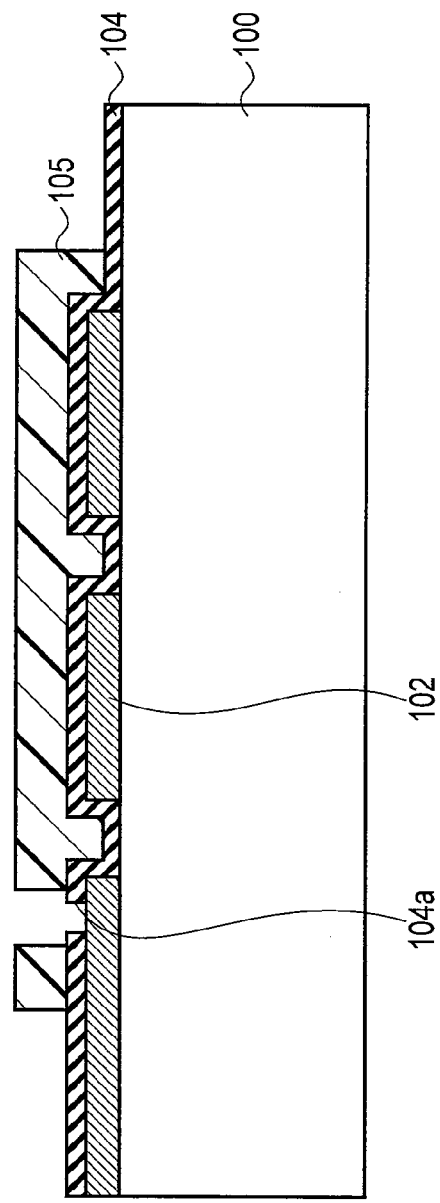

The first sacrificial layer 105 is patterned in a desired shape, as shown in FIG. 5. With this operation, the first metal interconnection 102 is exposed in the connecting hole portion 104a. The first sacrificial layer 105 may be patterned by light exposure and development. Alternatively, the first sacrificial layer 105 may be patterned using the RIE method and a resist pattern (not shown) formed on it using the normal lithography method. Again, an $SiO_X$ film (not shown) formed on the first sacrificial layer 105, for example, may be patterned as a hard mask using the RIE or wet etching method and a resist pattern using the normal lithography method, and the first sacrificial layer 105 may be patterned using the hard mask.

A second metal interconnection 106 consisting of, for example, aluminum is formed on the first sacrificial layer 105 and patterned, as shown in FIG. 6. The second metal interconnection 106 is formed to have a thickness of, for example, several hundred nanometers to several micrometers. With this operation, the second metal interconnection 106 is connected to the first metal interconnection 102 exposed in the connecting hole portion 104a. The sputtering method is used as a method of depositing the second metal interconnection 106. Also, as a patterning method, the conventional photolithography or RIE (Reactive Ion Etching) method, for example, may be used, or the photolithography and wet etching methods may be used.

An insulator connecting portion 107 constituted by, for example, an SiN film is formed between second metal interconnections 106 and patterned. The insulator connecting portion 107 is formed to have a thickness of, for example, several hundred nanometers to several micrometers. With this operation, the second metal interconnections 106 are connected to each other. As a depositing method and method of patterning the insulator connecting portion 107, the conventional semiconductor technique is used. A functional element 120 is thus completed as a movable portion.

A second sacrificial layer 108 formed by an organic material such as polyimide is applied to cover the functional element 120 and first sacrificial layer 105 in the step of forming a thin-film dome at a wafer level, as shown in FIG. 7. The second sacrificial layer 108 is formed to have a thickness of, for example, several hundred nanometers to several micrometers.

The second sacrificial layer 108 is patterned in a desired shape. The second sacrificial layer 108 may be patterned by light exposure and development. Alternatively, the second sacrificial layer 108 may be patterned using the RIE method and a resist pattern (not shown) formed on it using the normal lithography method. Again, an $SiO_X$ film (not shown) formed on the second sacrificial layer 108, for example, may be patterned as a hard mask using the RIE or wet etching method and a resist pattern using the normal lithography method, and the second sacrificial layer 108 may be patterned using the hard mask.

A first layer 111 having a plurality of through holes 110a, and a first recessed portion 150 and first projecting portion 160 on its upper surface is formed to cover the second sacrificial layer 108.

More specifically, first, a first insulating film 109 is formed on the entire surface, as shown in FIG. 8. The first insulating film 109 is constituted by an insulating film such as an $SiO_X$ film or an SiN film. As a method of depositing the first insulating film 109, the CVD method, for example, is used. The first insulating film 109 is patterned in a desired shape. As a method of patterning the passivation film 104, the photolithography or RIE method, for example, is used. With this operation, the first insulating film 109 is formed on the second sacrificial layer 108 as a reinforcing member to extend in, for example, the first and second directions.

A second insulating film 110 is formed continuously on the entire surface, as shown in FIG. 9. More specifically, the second insulating film 110 is formed on the first insulating film 109 (on the side and upper surfaces), on the second sacrificial layer 108, and on the passivation film 104. The second insulating film 110 is formed to have a constant thickness in the film deposition direction. The second insulating film 110 is constituted by an insulating film such as an $SiO_X$ film or an SiN film. The CVD method, for example, is used as a method of depositing the second insulating film 110. This makes it possible to form the first layer 111 having, on its upper surface, the first recessed portion 150 formed by the second insulating film 110 on the second sacrificial layer 108, and the first projecting layer 160 formed by the first insulating film 109 on the second sacrificial layer 108 and the second insulating film 110 on the first insulating film 109.

Next, as shown in FIG. 10, a resist (not shown) is applied to the first layer 111 (second insulating film 110). A plurality of through holes 110a for removing the first sacrificial layer 105 and the second sacrificial layer 108 are formed in the first layer 111 by a resist pattern (not shown) formed by the conventional lithography method and the RIE or wet etching method.

The plurality of through holes 110a are not formed in the thick first projecting portion 160 but in the thin first recessed portion 150 in the first layer 111. This makes it possible to facilitate the process for forming the through holes 110a.

Note that, the through hole 110a desirably has a size that gradually increases from the outside to the inside upon adjusting the selection ratio between the resist pattern (not shown) and the first layer 111. In other words, the through hole 110a desirably has a tapered shape with a size that gradually decreases from the outside to the inside. This is done to improve the sealing performance of the through holes 110a after the first sacrificial layer 105 and second sacrificial layer 108 (to be described later) are removed.

Figure 11:
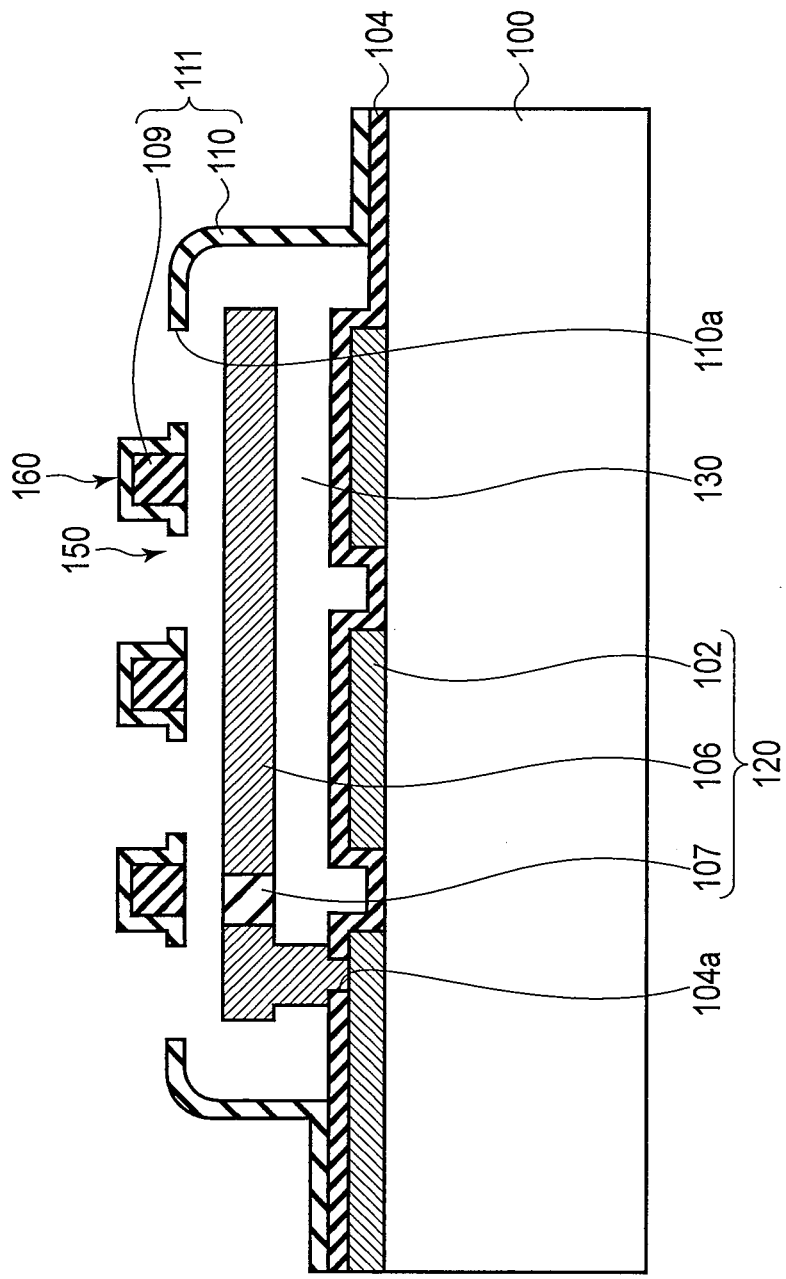

As shown in FIG. 11, by ashing using, for example, $O_2$ gas, $CF_4$ gas, or a gas mixture thereof, the resist pattern (not shown), first sacrificial layer 105, and second sacrificial layer 108 are removed. With this operation, the functional element 120 is released to form a cavity 130 as the operating space of the functional element 120.

The second layer 112 is formed on the first layer 111, as shown in FIG. 2. With this operation, the plurality of through holes 110a are closed to seal the cavity 130. The second layer 112 is formed to have a thickness of, for example, several hundred nanometers to several micrometers. The second layer 112 is formed by a coating film of an organic material such as polyimide, an SiN film, or an $SiO_X$ film. At this time, the second layer 112 may be formed up to the lower layers of the through holes 110a. In other words, the second layer 112 may be formed to fill the through holes 113a.

The third layer 113 as a moisture-proof film is formed on the second layer 112. The third layer 113 has a film thickness of several hundred nm to several μm. The third layer 113 is formed by, for example, an SiN film. An example of a method of forming the third layer 113 is the CVD method.

In forming the third layer 113, film forming conditions are decompression and heating. For this reason, decompression and heating generate a large stress in forming the third layer 113. In particular, the first layer 111 deforms (expands). By forming the first insulating film 109 serving as a reinforcing member, the first layer 111 forms the thick first projecting portion 160. This makes it possible to reduce the deformation of the first layer 111 and the occurrence of cracks caused by the stress generated in forming the third layer 113.

The third layer 113 is patterned in a desired shape. The third layer 113 is patterned using the RIE or wet etching method and a resist pattern (not shown) formed using the normal lithography method, thereby completing a thin-film dome.

Figure 12:
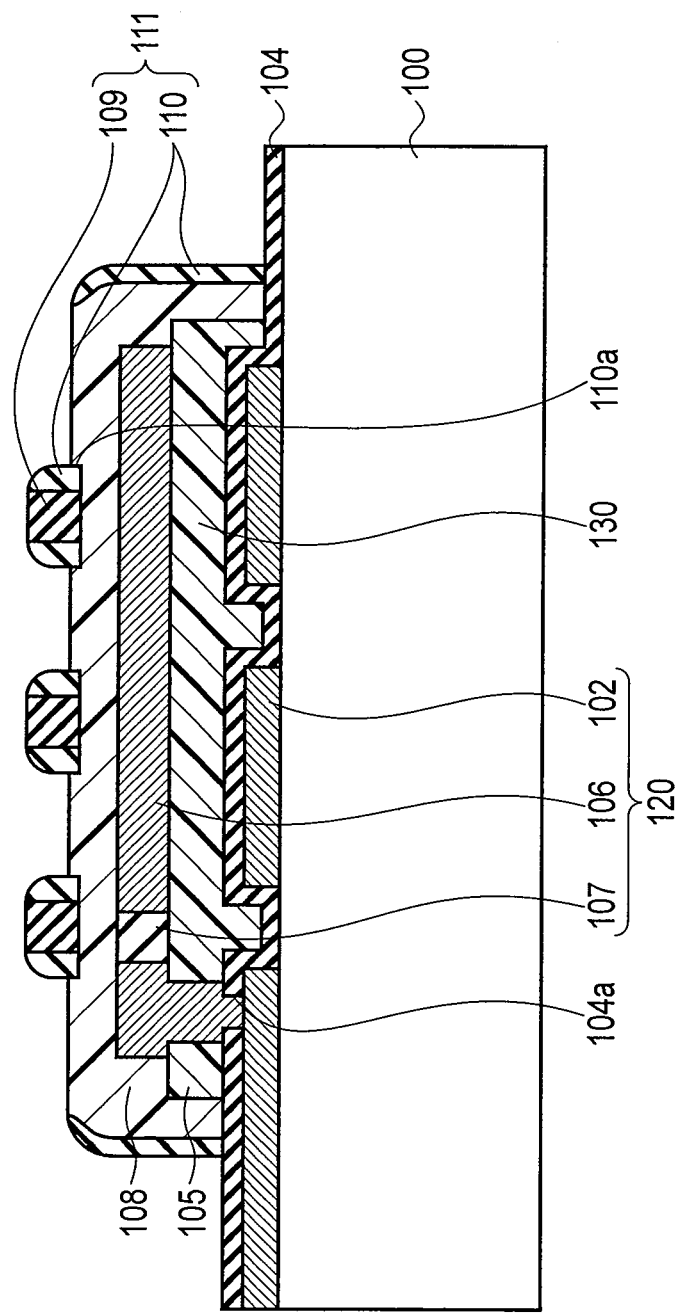
FIG. 12 is a sectional view illustrating another example of the step of manufacturing an electrical component according to the first embodiment.

Note that the plurality of through holes 110a may be formed in self-alignment with the side wall (second insulating film 110) of the first insulating film 109 serving as a reinforcing member. That is, after the second insulating film 110 is formed on the entire surface as shown in FIG. 9, part of the second insulating film 110 is removed by etch back as shown in FIG. 12, thereby forming the through holes 110a. More specifically, the second insulating film 110 is removed from the upper surface of the second sacrificial layer 108 and the upper surface of the first insulating film 109. The second insulating film 110 therefore remains on the side surface of the second sacrificial layer 108 and the side surface of the first insulating film 109. The side surfaces of the through hole 110a match with the side surfaces of the second insulating film 110 formed on the side surface of the second sacrificial layer 108 and the side surface of the first insulating film 109.

According to this self alignment process, a PEP (Photolithography Etching Process) need not be performed in forming the through holes 110a. This can facilitate formation of the through holes 110a.

[Effect According to First Embodiment]

According to the first embodiment, the first layer 111 serving as part of the thin-film dome has the first recessed portion 150 and the first projecting portion 160 on its upper surface and has a flat lower surface. That is, the first projecting portion 160 serves as a region having a large thickness in a direction perpendicular to the substrate surface. The recessed portion 150 serves as a region having a small thickness in the direction perpendicular to the substrate surface. This provides the following effects.

When a thick partial region (first projecting portion 160) is formed in the first layer 111, the mechanical strength of the first layer 111 is increased. This makes it possible to reduce the deformation of the first layer 111 caused by the stress generated in forming the third layer 113. As a result, cracks in the first layer 111 can be suppressed.

The though holes 110a are formed in the thin region (first recessed portion 150) in the first layer 111. This makes it possible to reduce the projection of durability of a resist mask or the like in forming the through holes 110a. This can facilitate the process for forming the through holes 110a.

[Modification to First Embodiment]

Figure 13:
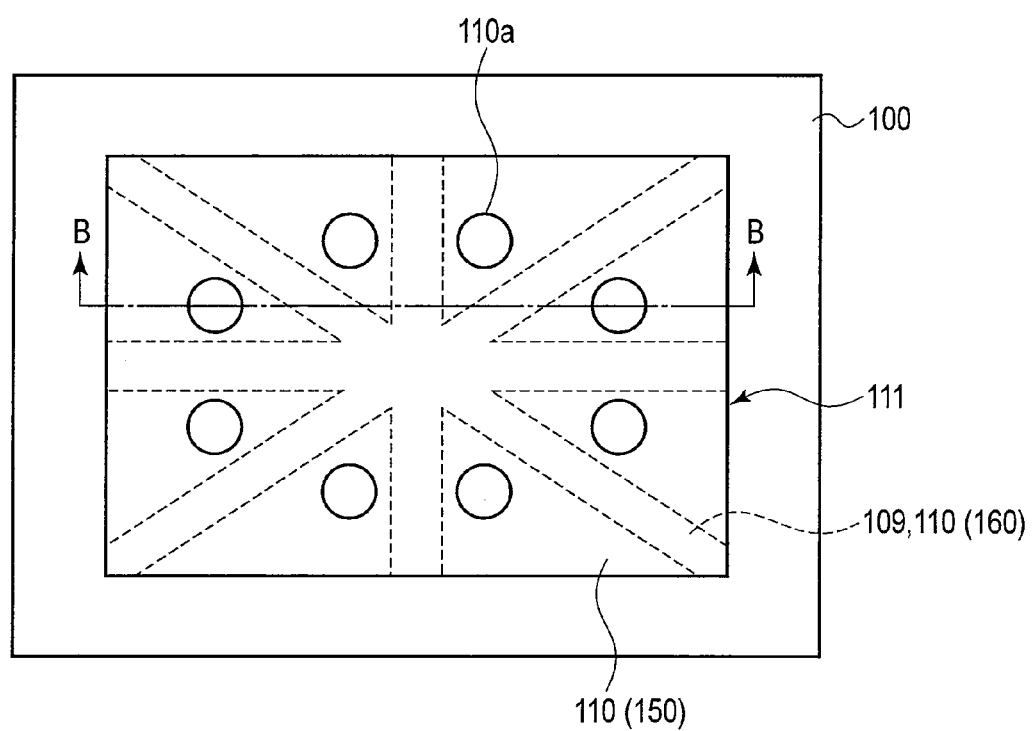
FIG. 13 is a plan view showing the structure of an electrical component according to the first modification to the first embodiment.
Figure 14:
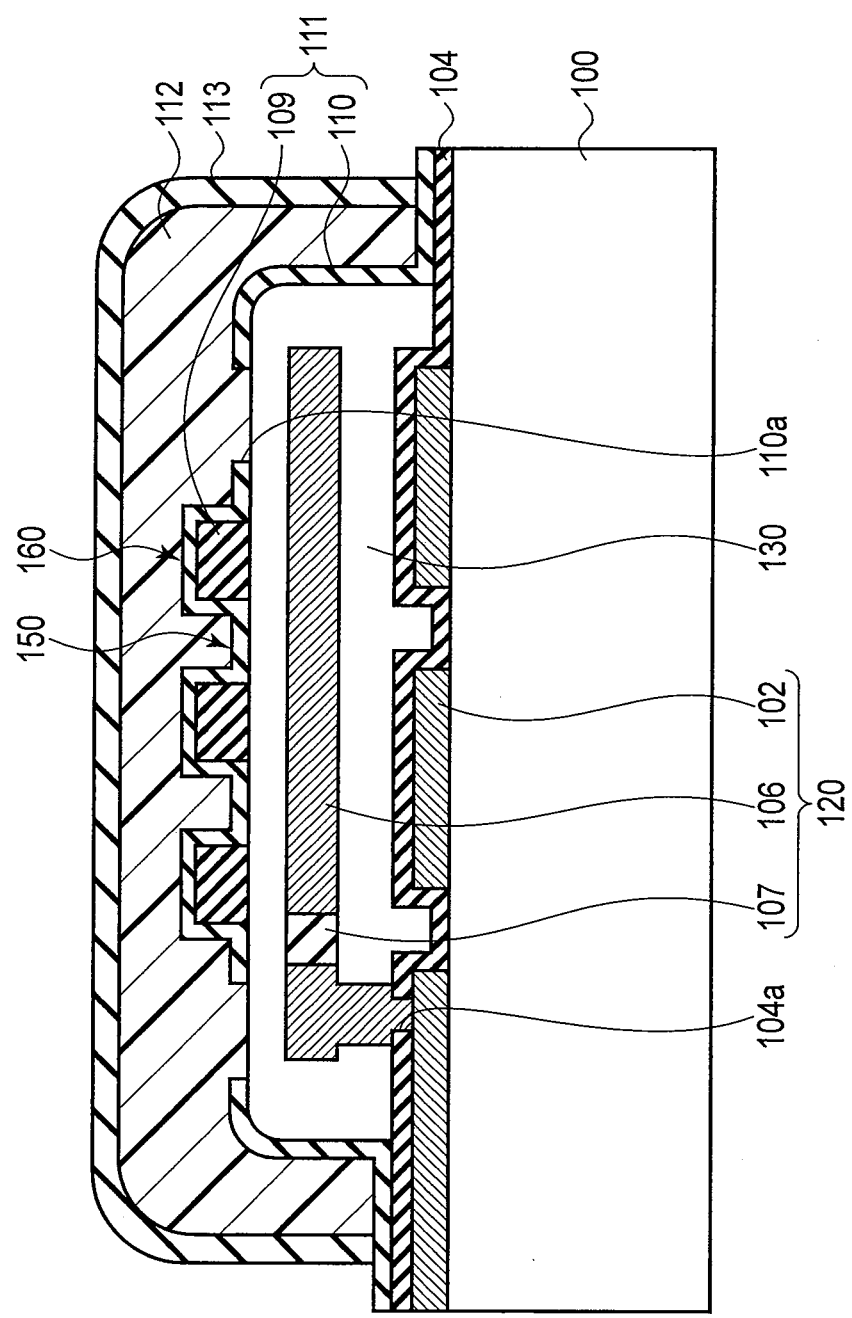
FIG. 14 is a sectional view taken along a line B-B in FIG. 13.

FIG. 13 is a plan view showing the structure of an electrical component according to the first modification to the first embodiment, and mainly shows the first layer 111. FIG. 14 is a sectional view taken along the line B-B in FIG. 13.

The first modification is different from the first embodiment in the formation region of the first projecting portion 160. More specifically, as shown in FIGS. 13 and 14, the first layer 111 has the first recessed portion 150 and the first projecting portion 160 on the upper surface of its upper portion. The first projecting portion 160 is formed to extend radially from the central portion of the first layer 111 in the plane.

As described above, the first projecting portion 160 having a large thickness extends radially from the center in the first layer 111, thereby increasing the mechanical strength of the first layer 111. This is because the stress acting on the first layer 111 increases toward the central portion. That is, the thickness of the first layer 111 which receives a large stress is increased to reinforce the first layer 111, thereby reducing the deformation of the first layer 111. As a result, cracks in the first layer 111 can be further suppressed.

Figure 15:
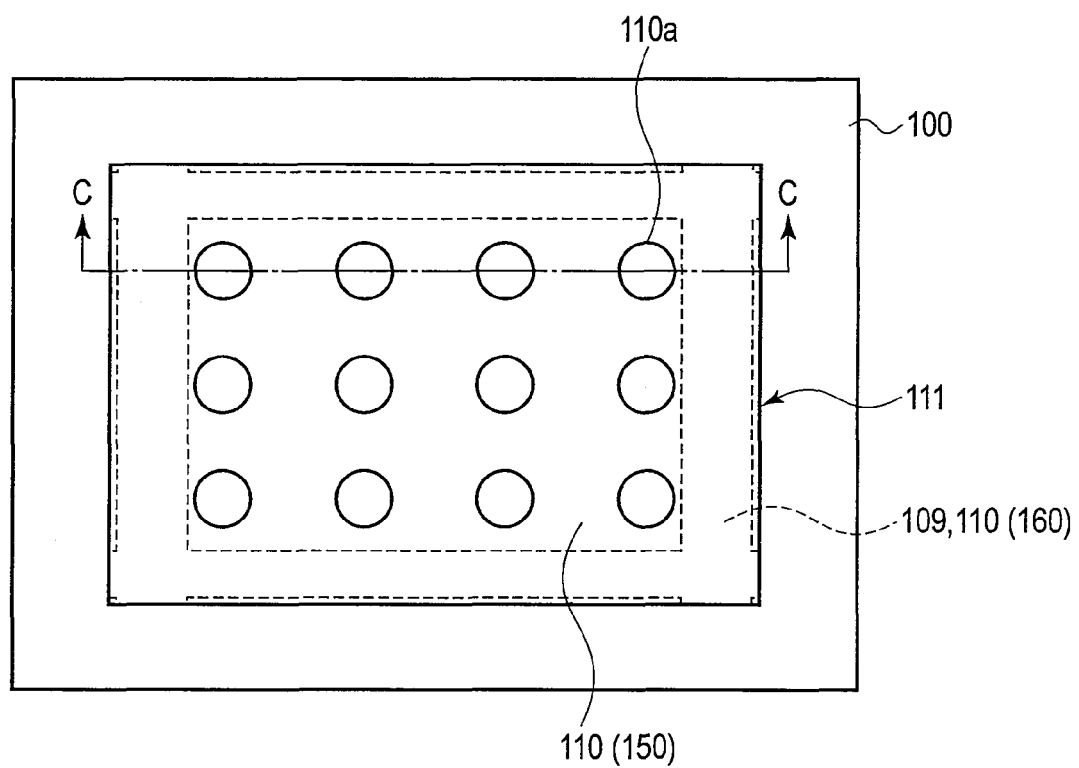
FIG. 15 is a plan view showing the structure of an electrical component according to the second modification to the first embodiment.
Figure 16:
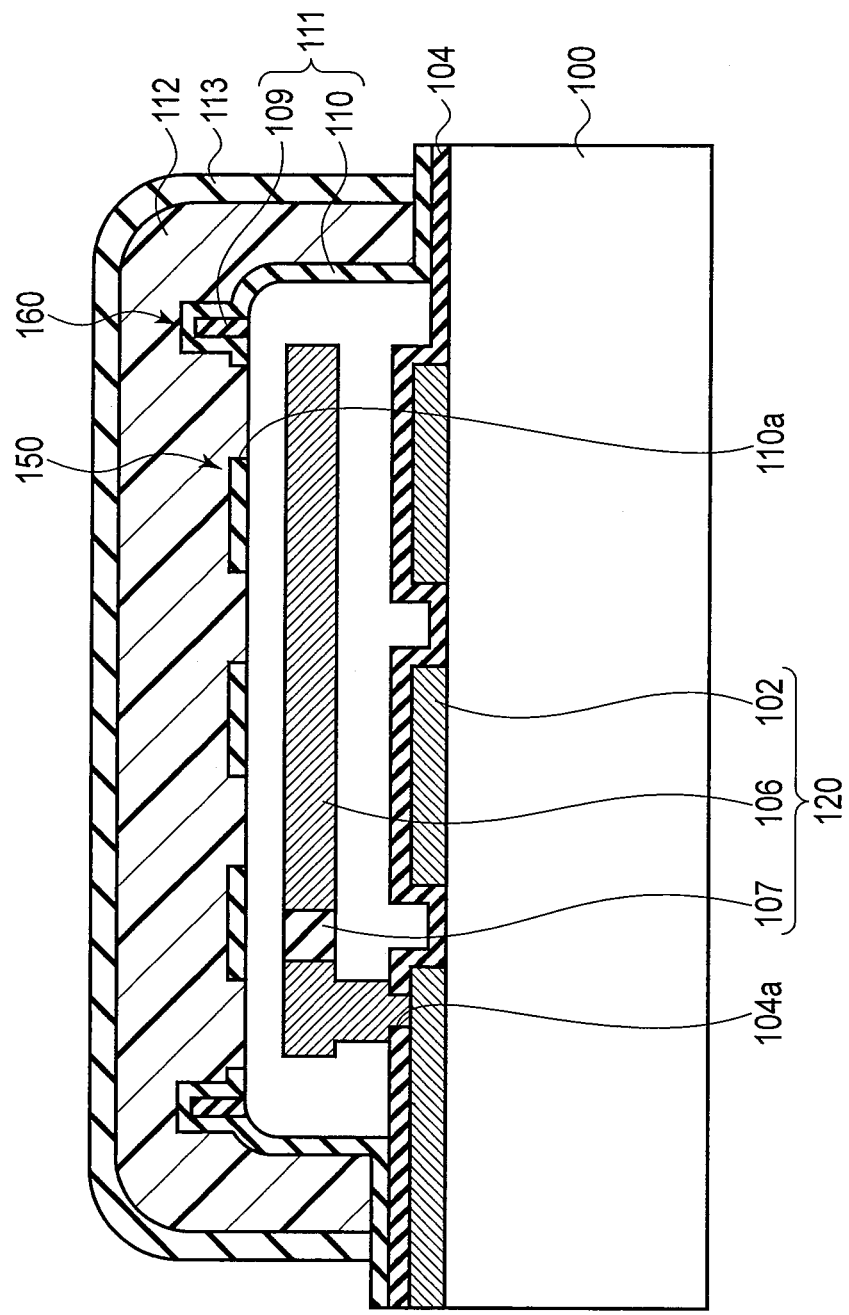
FIG. 16 is a sectional view taken along a line C-C in FIG. 15.

FIG. 15 is a plan view showing the structure of an electrical component according to the second modification to the first embodiment, and mainly shows the first layer 111. FIG. 16 is a sectional view taken along the line C-C in FIG. 15.

The second modification is different from the first embodiment in the formation region of the first projecting portion 160. More specifically, as shown in FIGS. 15 and 16, the first layer 111 has the first recessed portion 150 and the first projecting portion 160 on the upper surface of its upper portion. The first projecting portion 160 is formed to extend to the peripheral portion in the upper portion of the first layer 111 in the plane. In other words, the first projecting portion 160 is formed near the corners in the upper portion of the first layer 111.

As described above, when the first projecting portion 160 having a large thickness extends to the peripheral portion in the upper portion of the first layer 111, cracks in the first layer 111 can be further suppressed. This is because cracks mainly occur near the corners of the first layer 111. That is, when the film thickness of the first layer 111 near the corners where cracks frequently occur is increased to reinforce the first layer 111. Even if the deformation of the first layer 111 is large due to the stress, the occurrence of cracks near the corners can be suppressed.

<Second Embodiment>

An electrical component according to the second embodiment will be described with reference to FIGS. 17 to 25. In the first embodiment, the first layer 111 has the first recessed portion 150 and the first projecting portion 160 on its upper surface. To the contrary, according to the second embodiment, a first layer 111 also has a second recessed portion 170 and a second projecting portion 180 on its lower surface in addition to its upper surface. The second embodiment will be described in detail below.

The same parts as in the first embodiment will not be described in the second embodiment, and different points will be mainly be described in the second embodiment.

[Structure According to Second Embodiment]

Figure 17:
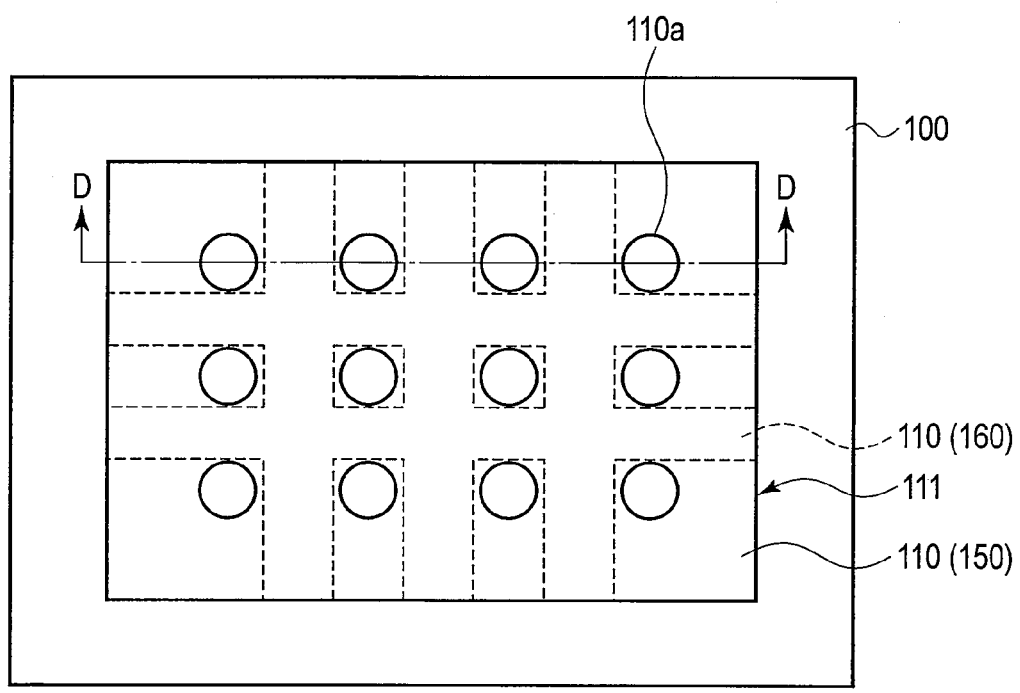
FIG. 17 is a plan view showing the structure of an electrical component according to the second embodiment.
Figure 18:
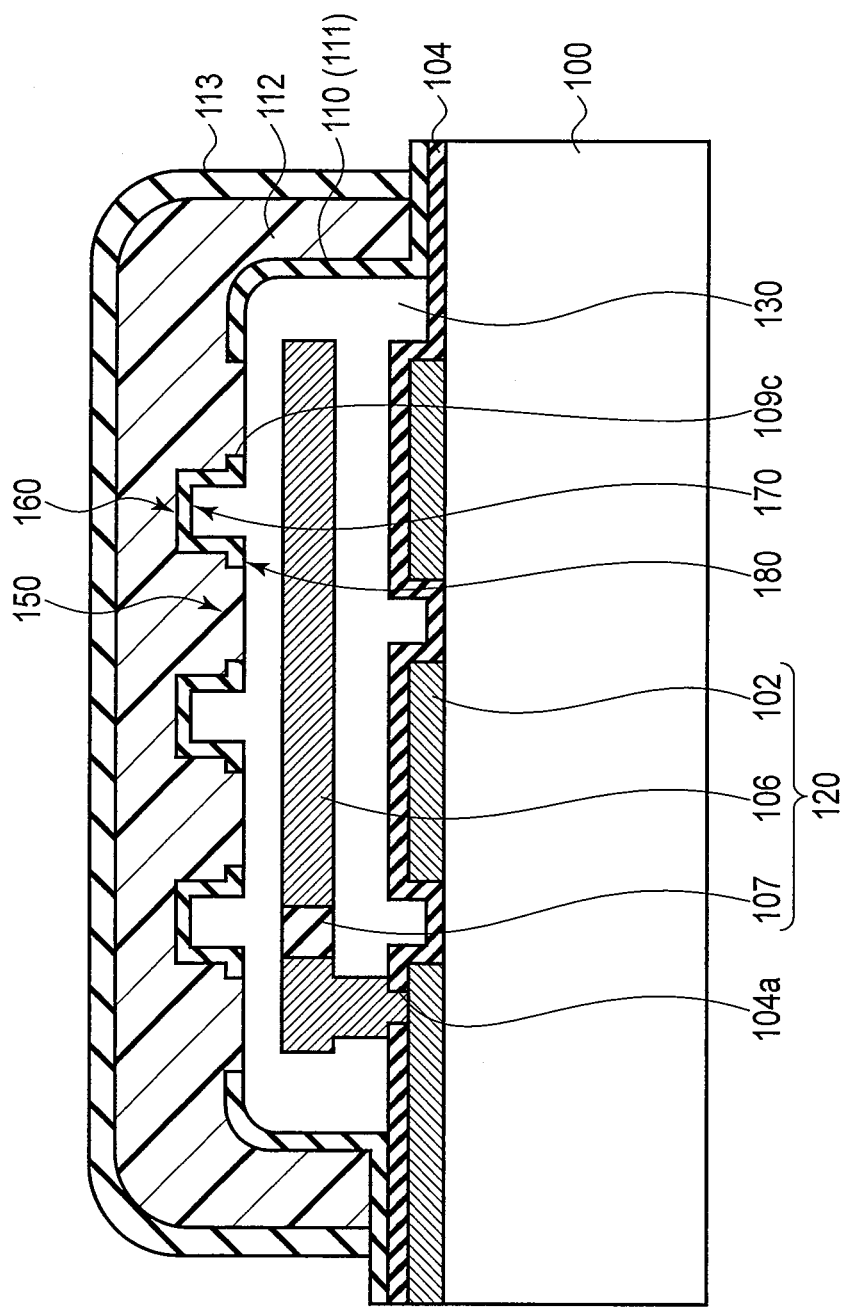
FIG. 18 is a sectional view taken along a line D-D in FIG. 17.
Figure 19:
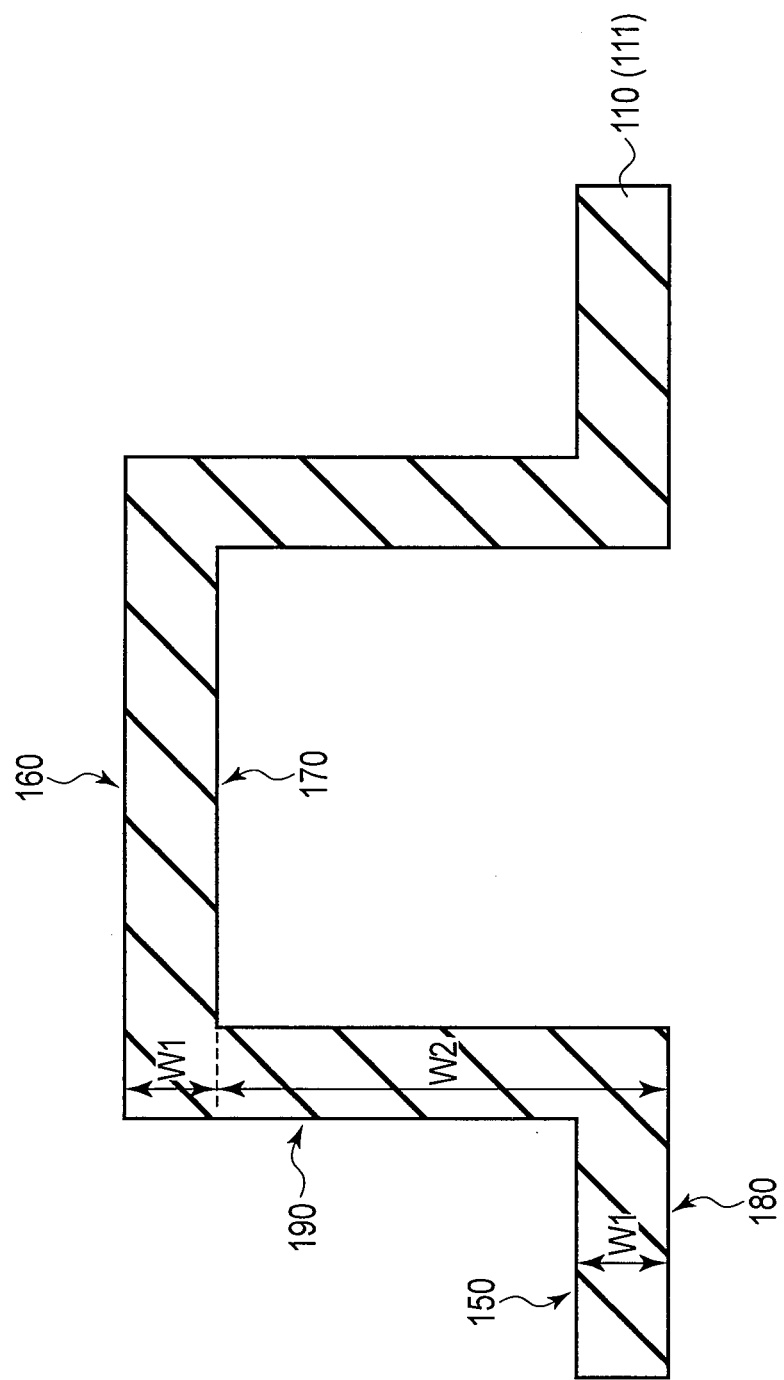
FIG. 19 is a partial enlarged view in FIG. 18.

FIG. 17 is a plan view showing the structure of an electrical component according to the second embodiment, and mainly shows the first layer 111. FIG. 18 is a sectional view taken along the line D-D in FIG. 17. FIG. 19 is a partially enlarged view in FIG. 17 and mainly shows the first layer 111.

The second embodiment is different from the first embodiment in that the first layer 111 also includes the second recessed portion 170 and the second projecting portion 180 on its lower surface.

More specifically, as shown in FIGS. 17 and 18, the first layer 111 according to the second embodiment has a first recessed portion 150 and a first projecting portion 160 on its upper surface. In addition, the first layer 111 has the second recessed portion 170 and the second projecting portion 180 on its lower surface. In other words, the first layer 111 has different heights on its upper and lower surfaces. With this structure, the first layer 111 has different film thicknesses in a direction perpendicular to the substrate surface. The thickness of the first layer 111 will be described in detail later.

Note that in the second embodiment, the first recessed portion 150 indicates a region except the first projecting portion 160 in the first layer 111. The second projecting portion 180 indicates a region except the second recessed portion 170 in the first layer 111. A stepped portion 190 is formed between the first recessed portion 150 (second projecting portion 180) and the first projecting portion 160 (second recessed portion 170) to connect them.

The first layer 111 is constituted by the side portions, upper portion, and corner portions connecting them in order to form a cavity 130. The first layer 111 has the first recessed portion 150 and the first projecting portion 160 on the upper surface of the upper portion. For example, the first projecting portion 160 extends in the first direction and the second direction perpendicular to the first direction in the plane. On the other hand, the first layer 111 has the second recessed portion 170 and the second projecting portion 180 on the lower surface of the upper portion. The second recessed portion 170 on the lower surface of the first layer 111 corresponds to the position of the first projecting portion 160 on its upper surface. The second recessed portion 180 on the lower surface of the first layer 111 corresponds to the position of the first recessed portion 150 on its upper surface.

The first layer 111 having the first recessed portion 150 and the first projecting portion 160 on its upper surface and the second recessed portion 170 and the second projecting portion 180 on its lower surface is formed by a second insulating film 110. The second insulating film 110 is in midair and is formed continuously on the entire surface of the structure. The second insulating film 110 is formed by an insulating film such as an $SiO_X$ film or SiN film.

As shown in FIG. 19, in the first layer 111 (second insulating film 110), the stepped portion 190 is formed between the first recessed portion 150 and the first projecting portion 160 (between the second recessed portion 170 and the second projecting portion 180). The film thickness of the stepped portion 190 in the direction perpendicular to the substrate surface is larger than the film thickness of the first recessed portion 150 and the first projecting portion 160 (second recessed portion 170 and second projecting portion 180) in the direction perpendicular to the substrate surface. More specifically, the film thickness of the stepped portion 190 in the direction perpendicular to the substrate surface is equal to the total film thickness of a film thickness W2 of a third sacrificial layer 210 (to be described later) and a film thickness W1 of the second insulating film 110 in the film deposition direction. On the other hand, the film thickness of the first recessed portion 150 and the first projecting portion 160 (second recessed portion 170 and second projecting portion 180) in the direction perpendicular to the substrate surface is equal to the film thickness W1 of the second insulating film 110 in the film deposition direction. The film thickness W2 of the third sacrificial layer 210 in the film deposition direction is equal to the difference in height between the first recessed portion 150 and the first projecting portion 160 (a difference in height between the second recessed portion 170 and the second projecting portion 180).

Note that the film thickness of the stepped portion 190 in the direction perpendicular to the substrate surface is, for example, about twice the film thickness of the first recessed portion 150 and the first projecting portion 160 (second recessed portion 170 and second projecting portion 180) in the direction perpendicular to the substrate surface. That is, the film thickness W1 of the second insulating film 110 in the film deposition direction is almost equal to the film thickness W2 of the third sacrificial layer 210 in the film deposition direction. More specifically, the film thickness of the stepped portion 190 in the direction perpendicular to the substrate surface is, for example, about 6 µm. The film thickness of the first recessed portion 150 and the first projecting portion 160 (second recessed portion 170 and second projecting portion 180) in the direction perpendicular to the substrate surface is about 3 µm.

As described above, when the first recessed portion 150 and the first projecting portion 160 (second recessed portion 170 and second projecting portion 180) are formed in the first layer 111 to form the stepped portion 190, the film thickness of the first layer 111 can be made partially thick in the direction perpendicular to the substrate surface. As a result, the mechanical strength of the first layer 111 can be increased.

As shown in FIGS. 17 and 18, a plurality of through holes 110a are formed in the first recessed portion 150 (second projecting portion 180) which is thin in the first layer 111. This makes it possible to facilitate the process for forming the through holes 110a.

Figure 21:
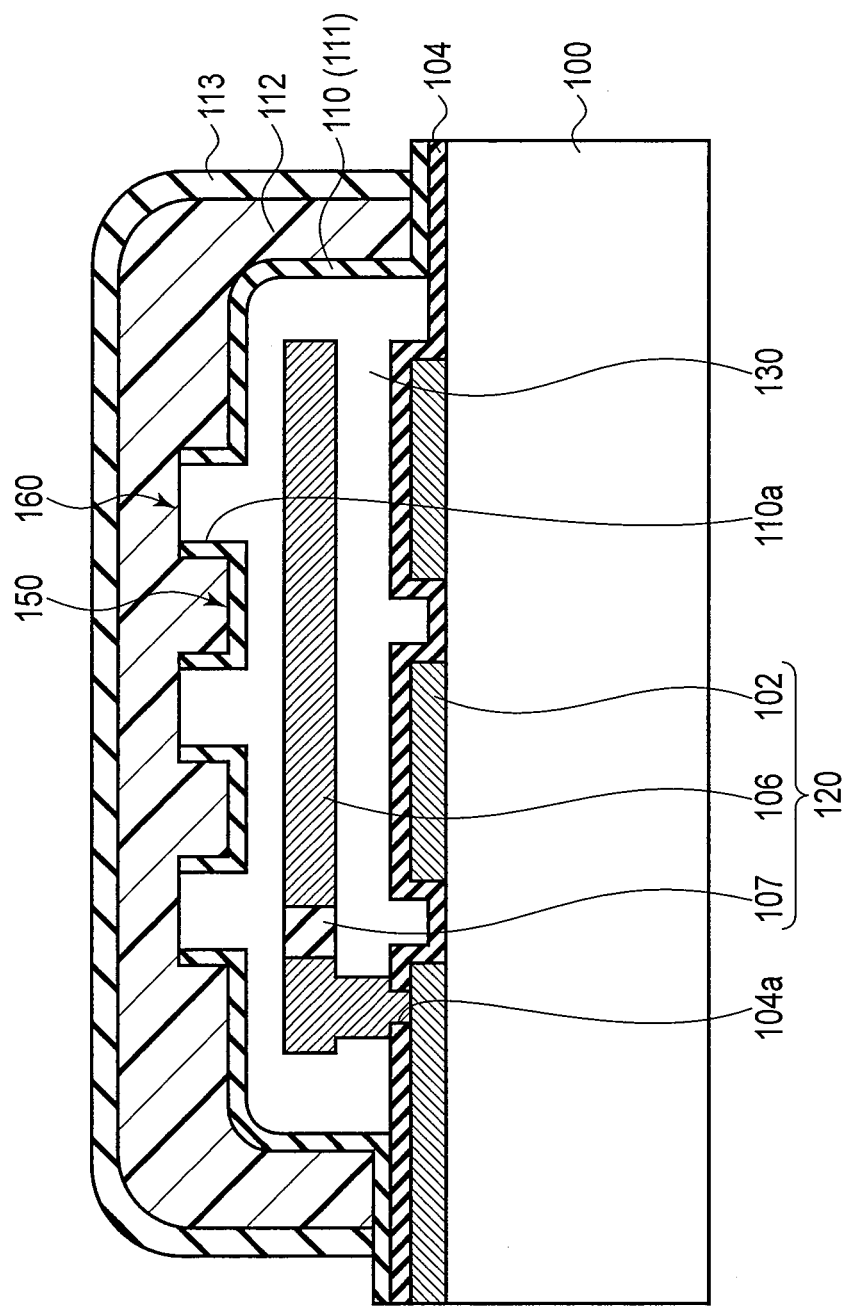
FIG. 21 is a sectional view taken along a line E-E in FIG. 17.

Note that as shown in FIGS. 20 and 21, the plurality of through holes 110a may be formed in the first projecting portion 160 (second recessed portion 170) which is thin in the first layer 111.

In FIGS. 17 to 21, the plurality of through holes 110a are formed in either of the first recessed portion 150 (second projecting portion 180) and the first projecting portion 160 (second recessed portion 170) in the first layer 111. The embodiment is not limited to this. The plurality of through holes 110a may be formed in either of the first recessed portion 150 (second projecting portion 180) and the first projecting portion 160 (second recessed portion 170) in the first layer 111. That is, the plurality of through holes 110a are formed in a region except the stepped portion 190 having a large film thickness in the first layer 111.

[Manufacturing Method According to Second Embodiment]

FIGS. 22 to 25 are sectional views of a method of manufacturing an electrical component according to the second embodiment. A method of forming a thin-film dome will be described from a method of forming a MEMS element in the electrical component of the second embodiment will be described below.

The steps in FIGS. 4 to 7 in the first embodiment are performed. That is, a second sacrificial layer 108 made of an organic material such as polyimide is applied to cover a MEMS element 120 and a first sacrificial layer 105. The second sacrificial layer 108 is then patterned into a desired shape.

The first layer 111 is formed to cover the second sacrificial layer 108 and have the plurality of through holes 110a, the first recessed portion 150 and first projecting portion 160 on its upper surface, and the second recessed portion 170 and second projecting portion 180 on its lower surface.

Figure 22:
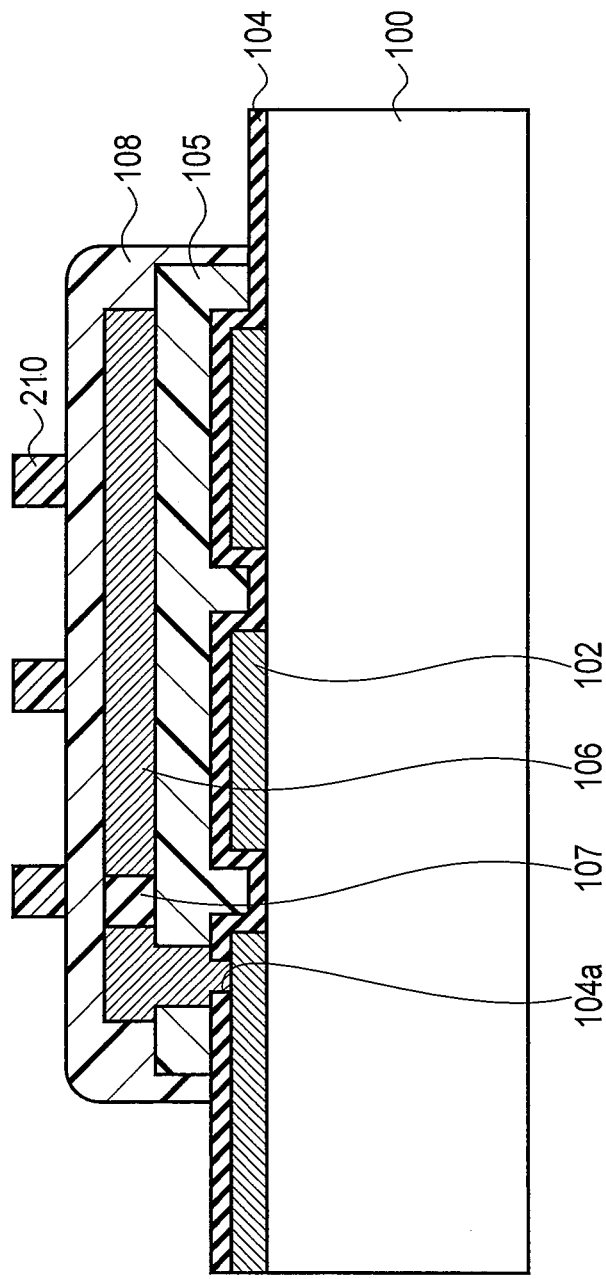
FIGS. 22 to 25 are sectional views showing the steps of manufacturing an electrical component according to the second embodiment.

More specifically, as shown in FIG. 22, a third sacrificial layer 210 made of an organic material such as polyimide is applied to the entire surface. The third sacrificial layer 210 is then patterned into a desired shape. The third sacrificial layer 210 may be patterned by photosensitive exposure and developed. Alternatively, the third sacrificial layer 210 may be patterned by the RIE method and a resist pattern (not shown) formed by the conventional lithography method on the third sacrificial layer 210. Alternatively, an $SiO_X$ film or the like (not shown) formed on the third sacrificial layer 210 may be patterned as a hard mask by a resist pattern by the conventional lithography method and the RIE or wet etching method. The third sacrificial layer 210 may be patterned using the above hard mask. The third sacrificial layer 210 is formed to extend on the second sacrificial layer 108 in, for example, the first and second directions.

Figure 23:
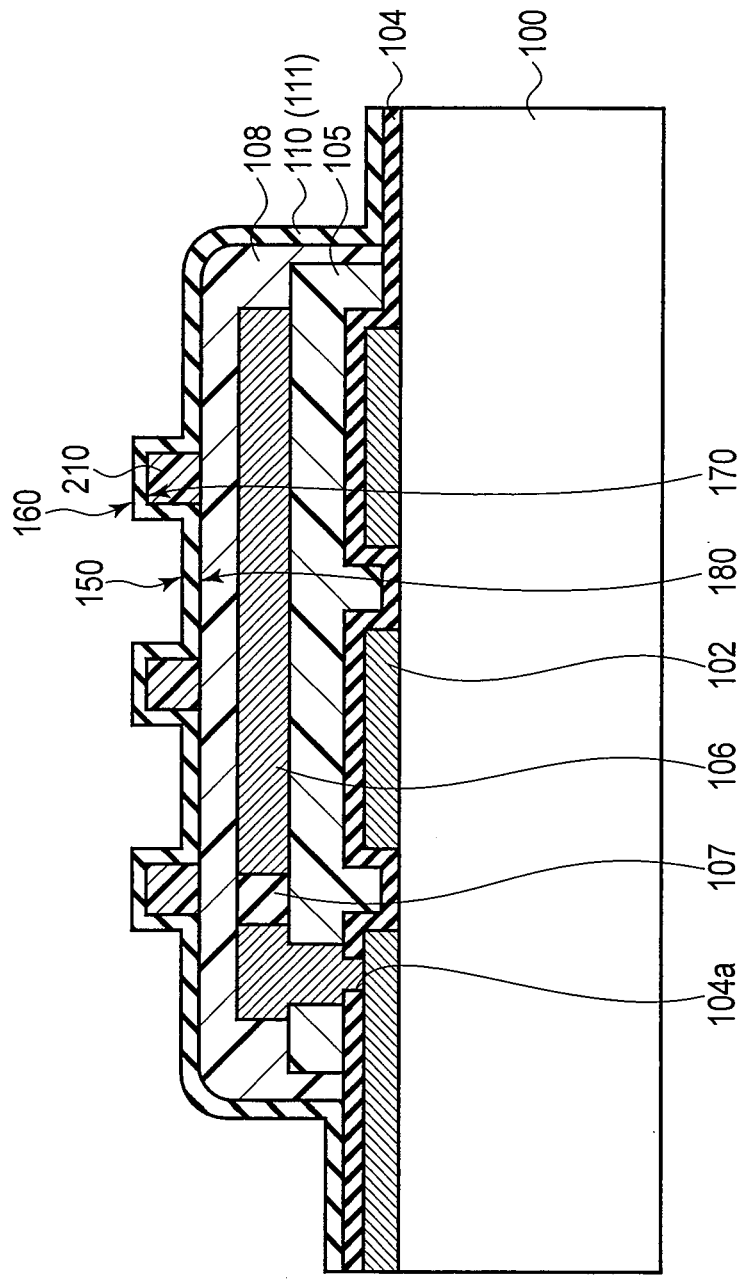

As shown in FIG. 23, the second insulating film 110 is formed continuously on the entire surface. More specifically, the second insulating film 110 is formed on the third sacrificial layer 210 (side surface and upper surface), second sacrificial layer 108, and a passivation film 104. The second insulating film 110 is formed so that, for example, the film thickness in the film deposition direction is constant. The second insulating film 110 is formed by an insulating film such as $SiO_X$ film or SiN film. A method of forming the second insulating layer 110 is, for example, the CVD method, thereby forming the first layer 111 having the first recessed portion 150 (second projecting portion 180) formed by the second insulating film 110 on the upper surface of the second sacrificial layer 108, the first projecting portion 160 (second recessed portion 170) formed by the second insulating film 110 on the upper surface of the third sacrificial layer 210, and the stepped portion 190 formed by the second insulating film 1109 on the side surface of the third sacrificial layer 210.

Figure 24:
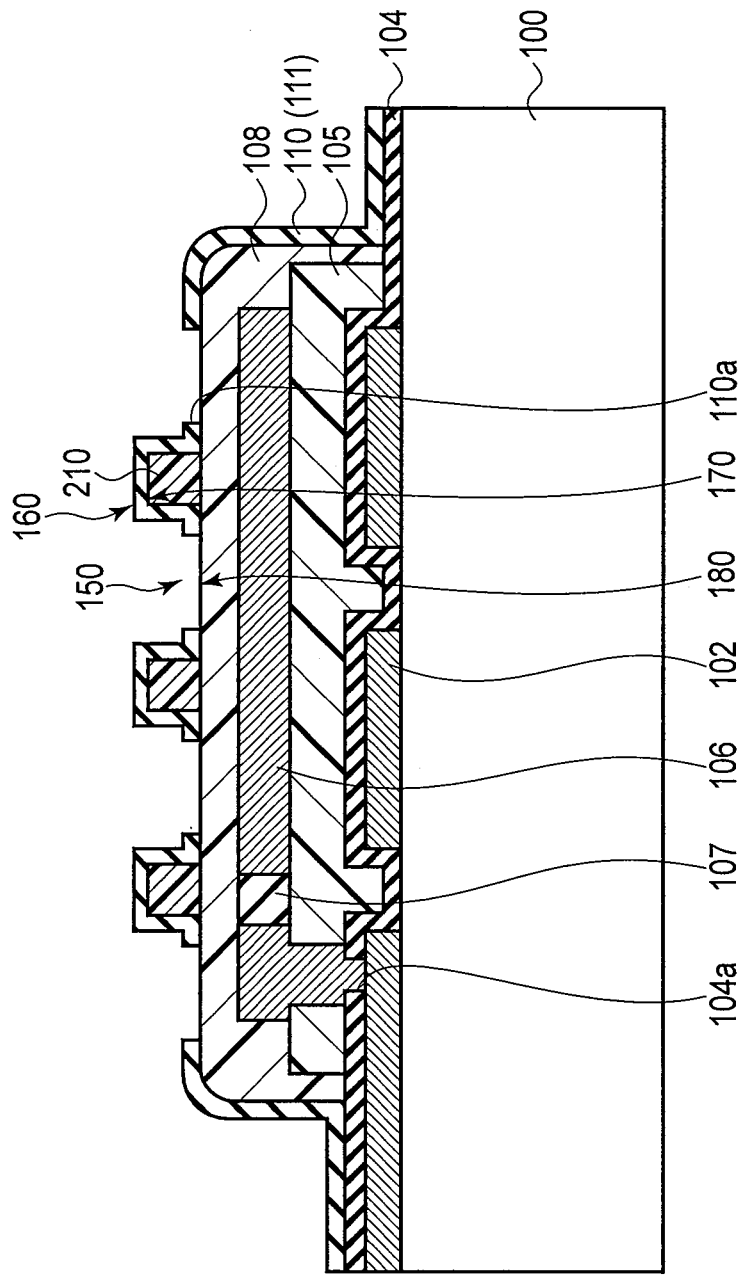

As shown in FIG. 24, a resist (not shown) is applied to the first layer 111 (second insulating film 110). The plurality of through holes 110a for removing the first sacrificial layer 105, second sacrificial layer 108, and third sacrificial layer 210 are formed in the first layer 111 by a resist pattern (not shown) formed by the conventional lithography method, and RIE or wet etching method.

At this time, the plurality of through holes 110a are formed not in the stepped portion 190 which is thick in the first layer 111, but the thin first recessed portion 150 (second projecting portion 180) and/or the first projecting portion 160 (second recessed portion 170) in it. This makes it possible to facilitate the process for forming the through holes 110a.

Figure 25:
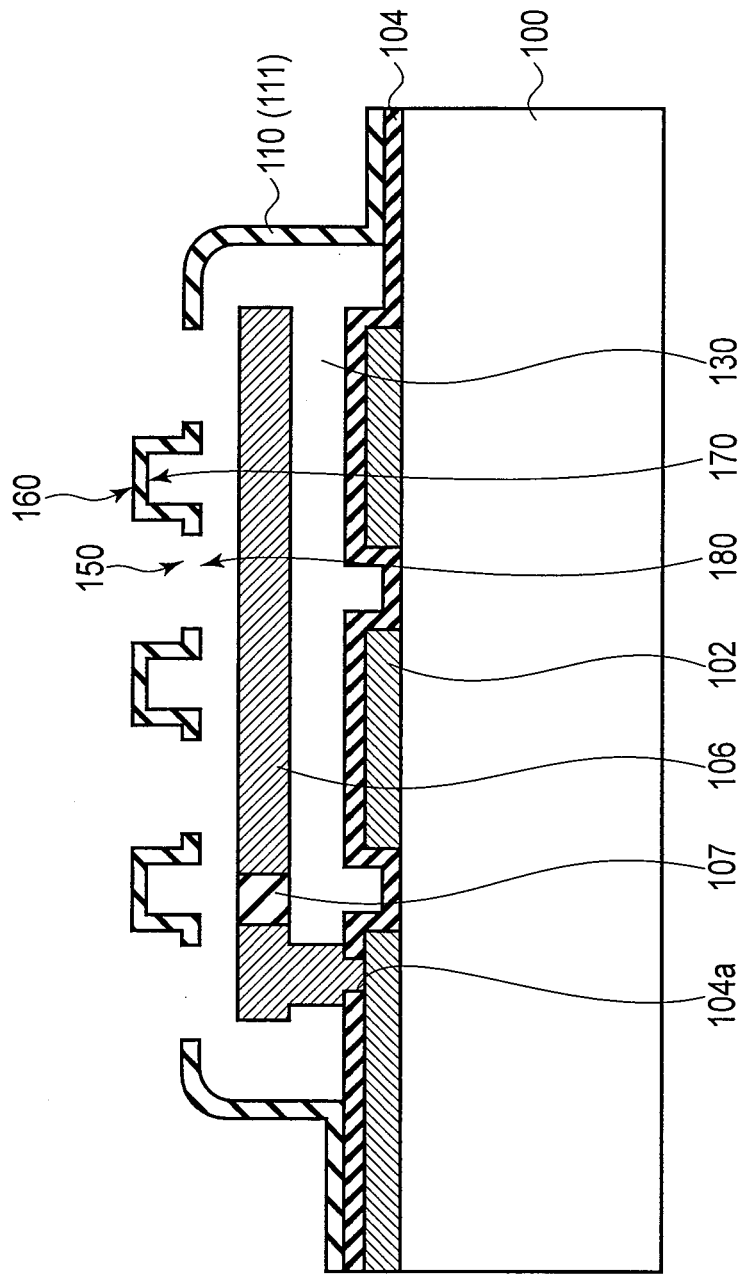

As shown in FIG. 25, the resist pattern (not shown), first sacrificial layer 105, second sacrificial layer 108, and third sacrificial layer 210 are removed by ashing using $O_2$ gas, $CF_4$ gas, or a gas mixture thereof. This can release the functional element 120, and form the cavity 130 serving as a space for operating the functional element 120. The first layer 111 (second insulating film 110) having the first recessed portion 150 and first projecting portion 160 on its upper surface, and the second recessed portion 170 and second projecting portion 180 on its lower surface is formed.

As shown in FIG. 18, the second layer 112 is formed on the first layer 111. This can close the plurality of through holes 110a and seal the cavity 130. The film thickness of the second layer 112 is, for example, several hundred nm to several µm. The second layer 112 is formed by a coating film of an organic material such as polyimide, or an SiN or $SiO_X$ film.

The third layer 113 as a moisture-proof film is formed on the second layer 112. The film thickness of the third layer 113 is, for example, several hundred nm to several µm. The third layer 113 is formed by, for example, an SiN film. A method of forming the third layer 113 is, for example, the CVD method.

In forming the third layer 113, film forming conditions are decompression and heating. For this reason, decompression and heating generate a large stress in forming the third layer 113. At this time, the first layer 111 has the first recessed portion 150 (second projecting portion 180) and the first projecting portion 160 (second recessed portion 170), thereby forming the thick stepped portion 190 between them. This can reduce the deformation of the first layer 111 caused by the stress generated in forming the third layer 113 and suppress the occurrence of cracks.

The third layer 113 is patterned in a desired shape. The third layer 113 is patterned using the RIE or wet etching method and a resist pattern (not shown) formed using the normal lithography method, thereby completing a thin-film dome.

[Effects According to Second Embodiment]

According to the second embodiment, the first layer 111 serving as part of the thin-film dome has the first recessed portion 150 and first projecting portion 160 on its upper surface, and the second projecting portion 180 and second recessed portion 170 on its lower surface at positions corresponding to the first recessed portion 150 and first projecting portion 160. The stepped portion 190 is formed between the first recessed portion 150 (second projecting portion 180) and the first projecting portion 160 (second recessed portion 170). That is, the first recessed portion 150 and first projecting portion 160 (second projecting portion 180 and second recessed portion 170) serve as a region thin in the direction perpendicular to the substrate surface. The stepped portion 190 between them serves as a region thick in the direction perpendicular to the substrate surface, thereby providing the following effects.

When a thick partial region (stepped portion 190) is formed in the first layer 111, the mechanical strength of the first layer 111 is increased. This makes it possible to reduce deformation of the first layer 111 caused by the stress generated in forming the third layer 113. As a result, the occurrence of cracks in the first layer 111 can be suppressed.

The though holes 110a are formed in the region (first recessed portion 150 (second projecting portion 180)) thin in the first layer 111 and/or the first projecting portion 160 (second recessed portion 170). This makes it possible to reduce the problem of poor durability of a resist mask in forming the through holes 110a. This can facilitate the process for forming the through holes 110a.

The through holes 110a may be formed in a region except the stepped portion 190, that is, either of the first recessed portion 150 and the first projecting portion 160. This can reduce the limitation of the formation region of the through holes 110a more than the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrical component comprising:
   a substrate;
   a functional element formed on the substrate;
   a first layer configured to form a cavity which stores the functional element on the substrate, the first layer having through holes, the first layer having a first recessed portion and a first projecting portion on an upper surface thereof, and the first layer having different film thicknesses in a direction perpendicular to a surface of the substrate; and
   a second layer formed on the first layer and configured to close the through holes,
   wherein the first projecting portion has a first insulating film and a second insulating film provided on the first insulating film, and the first recessed portion has the second insulating film.

2. The component of claim 1, wherein a lower surface of the first layer is flat, and a film thickness of the first projecting portion is larger than that of the first recessed portion.

3. The component of claim 2, wherein the through holes are formed in the first recessed portion in the first layer.

4. The component of claim 2, wherein the first projecting portion is formed by the first insulating film in midair, and the first recessed portion is formed by the second insulating film in midair.

5. The component of claim 4, wherein each of the first insulating film and the second insulating film is formed by one of an $SiO_x$ film and an SiN film.

6. The component of claim 2, wherein the film thickness of the first projecting portion is substantially twice that of the first recessed portion.

7. The component of claim 1, wherein the first projecting portion is formed radially from a central portion in the first layer.

8. The component of claim 1, wherein the first projecting portion is formed in a peripheral portion in the first layer.

* * * * *